US012487533B2

(12) United States Patent
Levinski et al.

(10) Patent No.: US 12,487,533 B2
(45) Date of Patent: Dec. 2, 2025

(54) AMPLITUDE ASYMMETRY MEASUREMENTS IN OVERLAY METROLOGY

(71) Applicant: KLA Corporation, Milpitas, CA (US)

(72) Inventors: Vladimir Levinski, Migdal HaEmek (IL); Andrew V. Hill, Sunriver, OR (US)

(73) Assignee: KLA Corporation, Milpitas, CA (US)

( * ) Notice: Subject to any disclaimer, the term of this patent is extended or adjusted under 35 U.S.C. 154(b) by 91 days.

(21) Appl. No.: 18/422,668

(22) Filed: Jan. 25, 2024

(65) Prior Publication Data

US 2025/0244682 A1 Jul. 31, 2025

(51) Int. Cl.
*G03F 7/00* (2006.01)

(52) U.S. Cl.
CPC .... *G03F 7/70633* (2013.01); *G03F 7/706837* (2023.05); *G03F 7/706849* (2023.05); *G03F 7/706851* (2023.05)

(58) Field of Classification Search
CPC ............ G03F 7/70633; G03F 7/70651; G03F 7/70653; G03F 7/70681; G03F 7/70683; G03F 7/706831; G03F 7/706835; G03F 7/706837; G03F 7/706843; G03F 7/706847; G03F 7/706849; G03F 7/706851; G01B 11/14; G01B 11/26; G01B 11/27; G01B 11/272
See application file for complete search history.

(56) References Cited

U.S. PATENT DOCUMENTS

| | | | |
|---|---|---|---|
| 7,528,941 B2 | 5/2009 | Kandel et al. | |
| 8,994,944 B2 * | 3/2015 | Cramer | G01N 21/88 |
| | | | 356/399 |
| 9,158,194 B2 * | 10/2015 | Koolen | G03F 9/70 |
| 9,946,167 B2 * | 4/2018 | Smilde | G06N 20/00 |
| 10,622,238 B2 * | 4/2020 | Gutman | H01L 21/681 |
| 10,677,588 B2 | 6/2020 | Hill et al. | |
| 11,101,153 B2 | 8/2021 | Levinski et al. | |
| 11,385,552 B2 * | 7/2022 | Jak | G03F 7/70158 |
| 2019/0049373 A1 | 2/2019 | Levinski | |

(Continued)

FOREIGN PATENT DOCUMENTS

WO 2023110318 A1 6/2023

OTHER PUBLICATIONS

Korean Intellectual Property Office, International Search Report and Written Opinion received in International Application No. PCT/US2025/012635, Apr. 29, 2025, 8 pages.

*Primary Examiner* — Gordon J Stock, Jr.
(74) *Attorney, Agent, or Firm* — Suiter Swantz IP

(57) ABSTRACT

A metrology system may include a controller to receive two or more images of the overlay target from one or more detectors of an optical sub-system, the overlay target including first and second periodic features generated with different measurement conditions, each measurement condition associated with at least one of a sample focal distance or a configuration of diffraction orders of the illumination by the overlay target that contributes to the associated image. The controller may further calculate an amplitude asymmetry associated of opposing diffraction orders of the illumination by the overlay target based on the two or more images and one or more quality metrics associated with the overlay target based on the amplitude asymmetry.

34 Claims, 27 Drawing Sheets

(56) References Cited

U.S. PATENT DOCUMENTS

| | | |
|---|---|---|
| 2019/0079413 A1* | 3/2019 | Mathijssen ............ G03F 7/7065 |
| 2021/0055215 A1 | 2/2021 | Pisarenco et al. |
| 2022/0155693 A1 | 5/2022 | Volkovich et al. |
| 2023/0418168 A1 | 12/2023 | Huisman et al. |

* cited by examiner

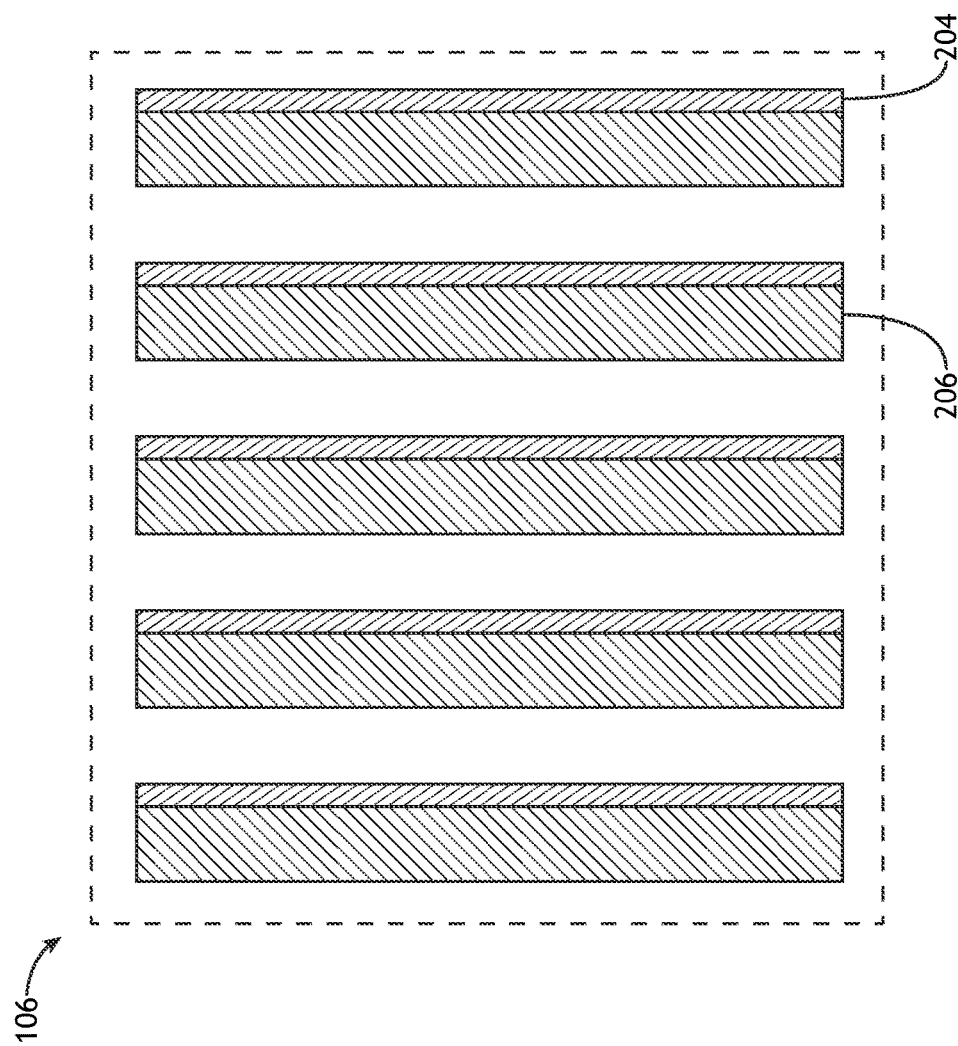

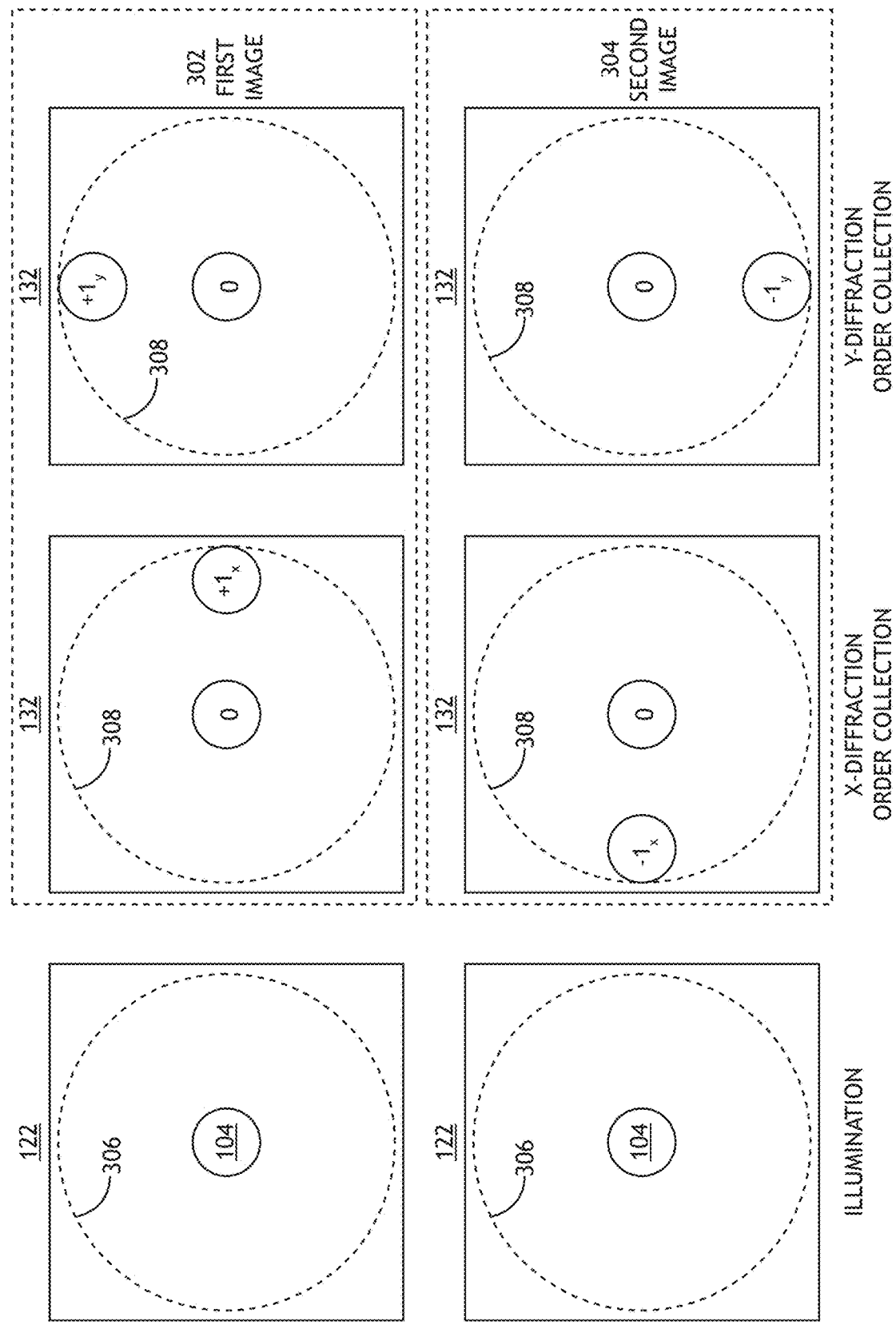

AMPLITUDE ASYMMETRY MEASUREMENTS IN OVERLAY METROLOGY

TECHNICAL FIELD

The present disclosure relates generally to overlay metrology and, more particularly, to measurements of amplitude asymmetry in overlay metrology.

BACKGROUND

Overlay metrology provides measurements of registration or misregistration of features on a sample associated with two or more patterning processes (e.g., lithographic exposure, etching, or the like). Many overlay metrology techniques including some optical techniques generate overlay measurements through characterization of dedicated overlay targets, where the measurements are intended to be representative of device features being fabricated by the patterning processes. This approach allows the overlay target to be designed to facilitate measurements using visible light while maintaining process compatibility.

However, as the size and/or pitch of fabricated devices (e.g., device features) is scaled down due to market demands, designing an overlay target for both visible light characterization and process compatibility becomes increasingly challenging and one criterion may need to be emphasized at the expense of the other. As an example, an emphasis on device compatibility may lead to decreased contrast or signal to noise ratios during optical measurements, which may decrease the accuracy of the result. As another example, an emphasis on characterization using visible light may lead to decreased process compatibility, which may lead to an overlay bias between a measured result and the actual properties of the sample. Additionally, process incompatibility may lead to target deformations such as, but not limited to, asymmetries of fabricated features that may induce errors in the overlay measurement.

There is therefore a need to develop systems and methods to cure the above deficiencies.

SUMMARY

In embodiments, the techniques described herein relate to a metrology system including a controller communicatively coupled to an optical sub-system configured to illuminate an overlay target on a sample with illumination from an illumination source when implementing a metrology recipe, where the overlay target in accordance with the metrology recipe includes first and second periodic features distributed along one or more measurement directions, where the first and second periodic features are associated with different patterning steps of a fabrication process for fabricating the overlay target, where the controller includes one or more processors configured to execute program instructions causing the one or more processors to implement the metrology recipe by receiving two or more images of the overlay target from one or more detectors of the optical sub-system, where the two or more images are generated with different measurement conditions, each measurement condition associated with at least one of a sample focal distance or a configuration of diffraction orders of the illumination by the overlay target that contributes to the associated one of the two or more images; calculating an amplitude asymmetry associated of opposing diffraction orders of the illumination by the overlay target based on the two or more images; and generating one or more quality metrics associated with the overlay target based on the amplitude asymmetry.

In embodiments, the techniques described herein relate to a metrology system, where the one or more processors are further configured to execute program instructions causing the one or more processors to implement the metrology recipe by controlling, via control signals, one or more process tools based on the one or more quality metrics.

In embodiments, the techniques described herein relate to a metrology system, where the one or more processors are further configured to execute program instructions causing the one or more processors to implement the metrology recipe by generating an overlay measurement associated with the overlay target based on the two or more images.

In embodiments, the techniques described herein relate to a metrology system, where the one or more processors are further configured to execute program instructions causing the one or more processors to correct an overlay measurement based on at least one of the two or more images using the amplitude asymmetry.

In embodiments, the techniques described herein relate to a metrology system, where the two or more images include a first image at a first sample focal distance and a second image at a second sample focal distance, where calculating the amplitude asymmetry associated of opposing diffraction orders of the illumination by the overlay target based on the two or more images includes calculating a first contrast of imaged periodic features in the first image; calculating a second contrast of the imaged periodic features in the second image; and calculating the amplitude asymmetry based on the first contrast, the second contrast, and at least one of a difference in overlay measured based on the first and second images or a difference in center of symmetry positions of the imaged periodic features in the first and second images.

In embodiments, the techniques described herein relate to a metrology system, where the two or more images include first and second images at a common sample focal distance, where the first image includes one or more positive diffraction orders from the overlay target, where the second image includes one or more negative diffraction orders from the overlay target, where calculating the amplitude asymmetry associated of opposing diffraction orders of the illumination by the overlay target based on the two or more images includes calculating the amplitude asymmetry based on a difference in amplitudes of the first or second periodic features based on the first and second images.

In embodiments, the techniques described herein relate to a metrology system, where the first and second periodic features are non-overlapping features.

In embodiments, the techniques described herein relate to a metrology system, where the first and second periodic features are overlapping features.

In embodiments, the techniques described herein relate to a metrology system, where the first and second periodic features have a common pitch.

In embodiments, the techniques described herein relate to a metrology system, where the first and second periodic features have different pitches.

In embodiments, the techniques described herein relate to a metrology system, where the illumination from the illumination source includes a single beam of illumination at a normal incidence angle.

In embodiments, the techniques described herein relate to a metrology system, where the illumination from the illumination source includes a single beam of illumination at an oblique incidence angle.

In embodiments, the techniques described herein relate to a metrology system, where the illumination from the illumination source includes a dipole including two beams of illumination with oblique incidence angles.

In embodiments, the techniques described herein relate to a metrology system, where the illumination from the illumination source includes a quadrupole including four beams of illumination with oblique incidence angles.

In embodiments, the techniques described herein relate to a metrology system, where the two or more images are generated simultaneously.

In embodiments, the techniques described herein relate to a metrology system, where the two or more images are generated sequentially.

In embodiments, the techniques described herein relate to an metrology system including an optical sub-system including one or more optical elements configured to illuminate an overlay target on a sample with illumination from an illumination source when implementing a metrology recipe, where the overlay target in accordance with the metrology recipe includes first and second periodic features distributed along one or more measurement directions, where the first and second periodic features are associated with different patterning steps of a fabrication process for fabricating the overlay target; a collection sub-system including one or more detectors; and one or more optical elements to direct light from the overlay target to the one or more detectors; and a controller communicatively coupled to the optical sub-system, where the controller includes one or more processors configured to execute program instructions causing the one or more processors to implement the metrology recipe by receiving two or more images of the overlay target from the one or more detectors, where the two or more images are generated with different measurement conditions, each measurement condition associated with at least one of a sample focal distance or a configuration of diffraction orders of the illumination by the overlay target that contributes to the associated one of the two or more images; calculating an amplitude asymmetry associated with opposing diffraction orders of the illumination by the overlay target based on the two or more images; and generating one or more quality metrics associated with the overlay target based on the amplitude asymmetry.

In embodiments, the techniques described herein relate to a metrology system, where the one or more processors are further configured to execute program instructions causing the one or more processors to implement the metrology recipe by controlling, via control signals, one or more process tools based on the one or more quality metrics.

In embodiments, the techniques described herein relate to a metrology system, where the one or more processors are further configured to execute program instructions causing the one or more processors to implement the metrology recipe by generating an overlay measurement associated with the overlay target based on the two or more images.

In embodiments, the techniques described herein relate to a metrology system, where the one or more processors are further configured to execute program instructions causing the one or more processors to correct an overlay measurement based on at least one of the two or more images using the amplitude asymmetry.

In embodiments, the techniques described herein relate to a metrology system, where the two or more images include a first image at a first sample focal distance and a second image at a second sample focal distance, where calculating the amplitude asymmetry associated of opposing diffraction orders of the illumination by the overlay target based on the two or more images includes calculating a first contrast of imaged periodic features in the first image; calculating a second contrast of the imaged periodic features in the second image; and calculating the amplitude asymmetry based on the first contrast, the second contrast, and at least one of a difference in overlay measured based on the first and second images or a difference in center of symmetry positions of the imaged periodic features based on the first and second images.

In embodiments, the techniques described herein relate to a metrology system, where the two or more images include first and second images at a common sample focal distance, where the first image includes one or more positive diffraction orders from the overlay target, where the second image includes one or more negative diffraction orders from the overlay target, where calculating the amplitude asymmetry associated of opposing diffraction orders of the illumination by the overlay target based on the two or more images includes calculating the amplitude asymmetry based on a difference in amplitudes of the first or second periodic features based on the first and second images.

In embodiments, the techniques described herein relate to a metrology system, further including correcting an overlay measurement based on at least one of the first or second images using the amplitude asymmetry.

In embodiments, the techniques described herein relate to a metrology system, where the first and second periodic features are non-overlapping features.

In embodiments, the techniques described herein relate to a metrology system, where the first and second periodic features are overlapping features.

In embodiments, the techniques described herein relate to a metrology system, where the first and second periodic features have a common pitch.

In embodiments, the techniques described herein relate to a metrology system, where the first and second periodic features have different pitches.

In embodiments, the techniques described herein relate to a metrology system, where the illumination from the illumination source includes a single beam of illumination at a normal incidence angle.

In embodiments, the techniques described herein relate to a metrology system, where the illumination from the illumination source includes a single beam of illumination at an oblique incidence angle.

In embodiments, the techniques described herein relate to a metrology system, where the illumination from the illumination source includes a dipole including two beams of illumination with oblique incidence angles.

In embodiments, the techniques described herein relate to a metrology system, where the illumination from the illumination source includes a quadrupole including four beams of illumination with oblique incidence angles.

In embodiments, the techniques described herein relate to a metrology system, where the two or more images are generated simultaneously.

In embodiments, the techniques described herein relate to a metrology system, where the two or more images are generated sequentially.

In embodiments, the techniques described herein relate to an overlay metrology method, including receiving two or more images of an overlay target from one or more detectors of an optical sub-system configured to illuminate an overlay target on a sample with illumination from an illumination source when implementing a metrology recipe, where the overlay target in accordance with the metrology recipe includes first and second periodic features distributed along one or more measurement directions, where the first and second periodic features are associated with different patterning steps of a fabrication process for fabricating the overlay target, where the two or more images are generated with different measurement conditions, each measurement condition associated with at least one of a sample focal distance or a configuration of diffraction orders of the illumination by the overlay target that contributes to the associated image; calculating an amplitude asymmetry associated of opposing diffraction orders of the illumination by the overlay target based on the two or more images; and generating one or more quality metrics associated with the overlay target based on the amplitude asymmetry.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 2C is a simplified top view of the cell in FIG. 2B, in accordance with one or more embodiments of the present disclosure.

FIG. 3 depicts illumination and collection conditions suitable for amplitude asymmetry measurements based on bright-field imaging of one-dimensional overlay targets with axial illumination, in accordance with one or more embodiments of the present disclosure.

DETAILED DESCRIPTION

Figure 1A:
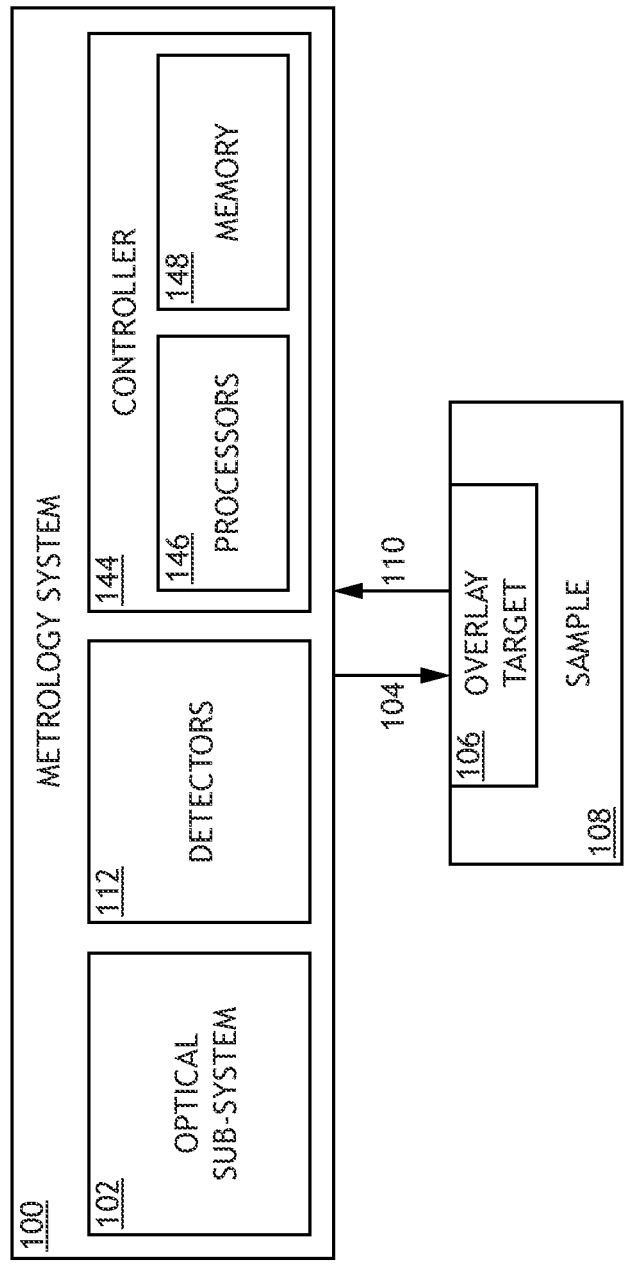
FIG. 1A is a block diagram view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for measuring and/or compensating for asymmetries of overlay target features generated during optical metrology measurements. For the purposes of the present disclosure, the term overlay is generally used to describe relative positions of features on a sample fabricated by two or more lithographic patterning steps, where the term overlay error describes a deviation of the features from a nominal arrangement. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

Overlay measurements may be used to generate correctables for both feedback and feed-forward process control. For example, overlay measured at a fabrication step (e.g., after a lithographic exposure of a pattern, after a development or etch step, or the like) on one sample may be used in a feedback loop to control processing tools (e.g., a lithographic stepper or scanner) for subsequent samples when performing the same fabrication step, which may be useful for compensation of process drifts. As another example, overlay measured at a fabrication step on a sample may be used as feedforward control of processing tools for subsequent processing steps of the same sample.

Various overlay metrology techniques along with corresponding overlay targets and metrology tools have been developed. Of these, optical metrology techniques may advantageously provide relatively high measurement throughput without damaging the sample during a measurement. In a general sense, optical overlay metrology may be performed by illuminating a sample (e.g., an overlay target on a sample) with illumination, collecting light emanating from the sample in response to the illumination, and generating a measurement based on the collected data. For example, image-based overlay metrology tools may illuminate an overlay target (e.g., an advanced imaging metrology (AIM) target, a box-in-box metrology target, or the like) and capture an overlay signal including an image of the overlay target based on a variety of imaging techniques including, but not limited to, bright-field imaging or dark-field imaging. Accordingly, overlay may be determined by measuring the relative positions of the overlay target features in the captured image (e.g., a field plane distribution). Further, diffraction-based overlay techniques may utilize specific diffraction orders generated by illuminating overlay targets having periodic features (e.g., AIM targets) with controlled angular illumination profiles. For example, a misregistration between periodic features associated with different patterning processes (e.g., an overlay error) may manifest as a phase difference between the associated features.

While in some applications overlay measurements may be performed directly on features of a device being fabricated (e.g., device features), overlay measurements are commonly performed on dedicated overlay targets printed using the same lithography steps as the device features. In this way, the features of an overlay target (e.g., target features) may be specially designed to facilitate overlay measurements.

A central challenge in overlay metrology is target asymmetry, which may be associated with an actual or apparent asymmetry of target features. Target asymmetry may be induced by a variety of factors. For example, target asymmetry may be induced by a sample tilt during a measurement. As another example, target asymmetry may be induced by incompatibilities of an overlay target design with a fabrication process (e.g., process incompatibilities). Optical overlay techniques typically require overlay targets having features that are substantially larger than the device features since the resolution of optical metrology tools are generally limited by the illumination wavelength. However, patterning techniques (e.g., lithographic exposure, etching, or the like) may exhibit layout-dependent patterning errors (errors that depend on factors such as, but not limited to, the size, pitch, density, or orientation of features). As a result, printing characteristics of the overlay target features may not match those of the device features, which may result in errors in an overlay measurement. Such errors may be referred to as overlay bias. This overlay bias may be mitigated in part due to techniques such as segmentation in which the larger features are segmented into finer structures that more closely resemble the device features of interest. Nonetheless, process compatibility of overlay targets for optical metrology remains a challenge as the size and pitch of device features continues to shrink.

In optical targets with periodic structures (e.g., AIM style targets or other diffraction-based overlay targets), target asymmetry may manifest as phase and/or amplitude asymmetry between opposite diffraction orders (e.g., diffraction orders of opposite sign such as +/−1 diffraction orders, or the like). These induced phase and/or amplitude asymmetries induced by target asymmetry rather than feature misregistration during lithography may impact an overlay measurement in different ways. Phase asymmetries may directly result in a measurement error (e.g., an overlay bias) since overlay is typically determine directly from phase measurements. It may further be difficult to identify or correct such measurement errors without additional information. For example, image-based overlay metrology techniques may generate measurements primarily on a phase difference between image target features in the image (e.g., based on imaged positions of features). As a result, phase asymmetries may directly manifest as shifts of imaged features and thus appear as an overlay error (e.g., feature misregistration).

Amplitude asymmetries on the other hand may typically impact the measurement contrast and thus the measurement sensitivity rather than a measured value itself. It is contemplated herein that amplitude asymmetry measurements may beneficially serve as a metric for identifying the presence of target asymmetry and thus may provide an indication of potential measurement error. In some embodiments, such amplitude asymmetry measurements are used for process control by serving as the basis for correctables to process tools for mitigating target asymmetry during fabrication. In some embodiments, amplitude asymmetry measurements are used as a metric directly and/or as a basis for generating a metric for correlating optical measurements to higher-resolution measurements such as, but not limited to, scanning electron microscope (SEM) measurements, other particle-beam measurements, or X-ray measurements.

Previous techniques for dealing with amplitude and/or phase asymmetries in overlay targets suitable for optical overlay metrology generally suffer from poor throughput, insensitivity, or incomplete information.

As an illustration, one technique relies on phenomenological multi-wavelength measurements to identify patterns that are proportional to target asymmetry amplitude, which may then be used to generate corrections to mitigate overlay bias. Multi-wavelength techniques are generally described in U.S. Pat. No. 11,101,153 issued on Aug. 24, 2021, which is incorporated herein by reference in its entirety. However, multi-wavelength measurement techniques may suffer from relatively long measurement times. There is also an inherent tradeoff associated with the spectrum selection since wavelengths providing relatively high sensitivity to target asymmetry may negatively impact the measurement precision or robustness, whereas wavelengths providing relatively low sensitivity to target asymmetry may provide poor monitoring data of the target asymmetry. Further, such techniques may relate to the combined contributions of amplitude and phase asymmetries rather than individual measurements thereof.

As another illustration, various techniques may be developed that are insensitive to amplitude asymmetries. For example, illumination of overlay targets with two opposing illumination beams may reduce or eliminate the impact of amplitude asymmetries of opposing diffraction orders. A multi-beam technique is generally described in U.S. Pat. No. 7,528,941 issued May 5, 2009, which is incorporated herein by reference in its entirety. However, such techniques may not provide information on the values of asymmetries for monitoring or other purposes.

Embodiments of the present disclosure are directed to systems and methods for measuring amplitude asymmetry in optical metrology using periodic overlay targets. Such a measurement may then be used as a metric for characterizing a target design and/or a fabrication process. Such a measurement may also be used to generate correctables for both feedback and feed-forward process control. In some embodiments, two or more images of an overlay target are generated using different measurement conditions, where the measurement conditions are selected to facilitate both an overlay measurement and a measurement of amplitude asymmetry. Such measurements may generally be generated sequentially or simultaneously. For example, sequential measurements may be generated by generating a first image under first measurement conditions, adjusting the measurement conditions, generating a second image under the new measurement conditions, and so on. As another example, simultaneous images may be generated using a multi-channel overlay metrology system. For instance, an overlay metrology tool may include at least two collection channels with separate detectors suitable for the simultaneous generation of two or more images.

In some embodiments, images of an overlay target are generated at two or more focal positions (e.g., a separation distance between the overlay target and components of an overlay metrology system during a measurement). A value of the amplitude asymmetry in this configuration may be determined based on calculated overlay values at each focal position as well as measured contrast of imaged target features at each focal position.

In some embodiments, two images of an overlay target are generated at a common focal position, where a first image includes (or is based on) one or more positive diffraction orders from the overlay target and a second image includes one or more negative diffraction orders from the overlay target. In this configuration, the amplitude asymmetry may be generated based on the contrast or amplitudes of the imaged features in the two images. Further, the contribution of the amplitude asymmetry to an overlay measurement may be reduced or eliminated by taking a half difference between the overlay values generated based on the two images. It is further contemplated that such a technique may be suitable for a wide range of overlay target types and associated overlay measurement techniques including, but not limited to, targets with non-overlapping or overlapping periodic features from different patterning processes.

Referring now to FIGS. 1A-23, systems and methods for measuring both overlay from overlay targets with periodic features using optical techniques and amplitude asymmetry of opposing diffraction orders from the periodic features, in accordance with one or more embodiments of the present disclosure.

FIG. 1A is a block diagram view of a metrology system 100, in accordance with one or more embodiments of the present disclosure. In some embodiments, the metrology system 100 may be an overlay metrology system.

In some embodiments, the metrology system 100 includes an optical sub-system 102 to acquire overlay signals from overlay targets based on any number of metrology recipes. For example, the optical sub-system 102 may direct illumination 104 to an overlay target 106 on a sample 108, collect light or other radiation emanating from the overlay target 106 (referred to herein as sample light 110), and generate two or more images of the overlay target 106 using one or more detectors 112. The images may include one or more field-plane images from a detector 112 located at a field plane conjugate to the sample 108 (or at least one layer therein) and/or one or more pupil-plane images from a detector 112 located at a pupil plane (e.g., a diffraction plane) associated with an angular distribution of light emanating from the overlay target 106.

Figure 1B:
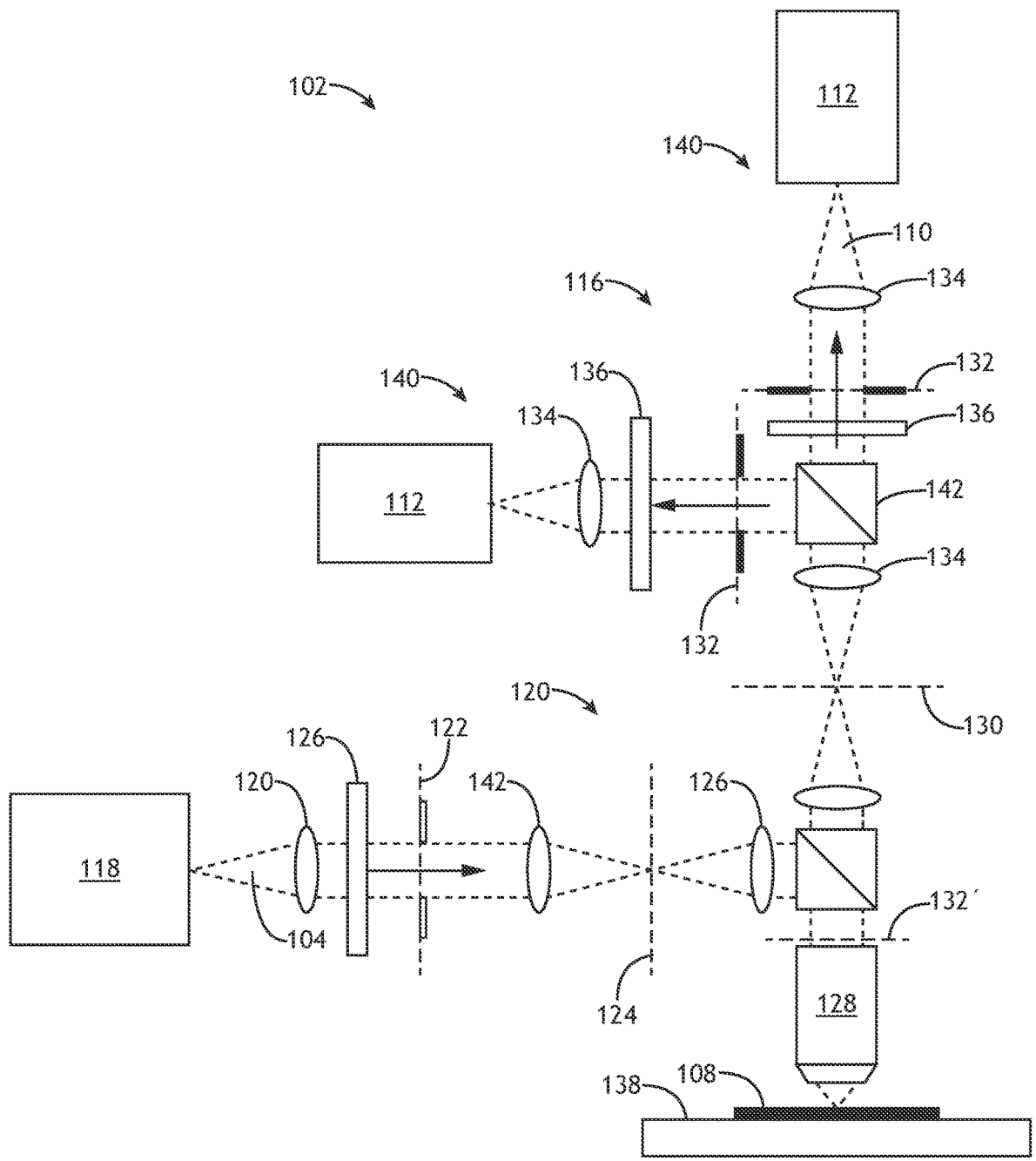
FIG. 1B is a simplified schematic of an overlay metrology sub-system, in accordance with one or more embodiments of the present disclosure.

FIG. 1B is a simplified schematic of an optical sub-system 102, in accordance with one or more embodiments of the present disclosure.

In some embodiments, the optical sub-system 102 includes an illumination sub-system 114 to generate illumination 104 in the form of one or more illumination beams to illuminate the sample 108 and a collection sub-system 116 to collect light from the illuminated sample 108 (e.g., sample light 110).

In some embodiments, the illumination sub-system 114 includes an illumination source 118 configured to generate the illumination 104 in the form of at least one illumination beam. The illumination from the illumination source 118 may include one or more selected wavelengths of light including, but not limited to, ultraviolet (UV) radiation, visible radiation, or infrared (IR) radiation. The illumination source 118 may include any type of illumination source suitable for providing at least one illumination beam. In some embodiments, the illumination source 118 is a laser source. For example, the illumination source 118 may include, but is not limited to, one or more narrowband laser sources, a broadband laser source, a supercontinuum laser source, a white light laser source, or the like. In this regard, the illumination source 118 may provide an illumination beam having high coherence (e.g., high spatial coherence and/or temporal coherence). In some embodiments, the illumination source 118 includes a laser-sustained plasma (LSP) source. For example, the illumination source 118 may include, but is not limited to, a LSP lamp, a LSP bulb, or a LSP chamber suitable for containing one or more elements that, when excited by a laser source into a plasma state, may emit broadband illumination.

In embodiments with two or more illumination beams, these beams may be generated using a variety of techniques. In some embodiments, the illumination sub-system 114 includes two or more apertures at an illumination pupil plane 122. In some embodiments, the illumination sub-system 114 includes one or more beamsplitters to split illumination from the illumination source 118 into the two or more illumination beams. In some embodiments, at least one illumination source 118 generates two or more illumination beams directly. In a general sense, each illumination beam may be considered to be a part of a different illumination channel regardless of the technique in which the various illumination beams are generated.

In some embodiments, the illumination sub-system 114 includes one or more optical components suitable for modifying and/or conditioning the one or more illumination beams as well as directing the one or more illumination beams to the sample 108. For example, the illumination sub-system 114 may include one or more illumination lenses 120 (e.g., to collimate the one or more illumination beams, to relay an illumination pupil plane 122 and/or an illumination field plane 124, or the like). In some embodiments, the illumination sub-system 114 includes one or more illumination control optics 126 to shape or otherwise control the one or more illumination beams. For example, the illumination control optics 126 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In some embodiments, the optical sub-system 102 includes an objective lens 128 to focus the one or more illumination beams onto the sample 108 (e.g., an overlay target with overlay target elements located on two or more layers of the sample 108).

In some embodiments, the one or more illumination beams may be angularly limited on the sample 108 such that periodic structures in the overlay target 106 may generate discrete diffraction orders. Further, the one or more illumination beams may be spatially limited such that they may illuminate selected portions of the sample 108. For instance, each of the one or more illumination beams may be spatially limited to the size of an overlay target 106. In this way, the one or more illumination beams may fully illuminate (e.g., overfill) the overlay target 106).

In some embodiments, the collection sub-system 116 includes one or more detectors 112, where any detector 112 may be located at a collection field plane 130 conjugate to the overlay target 106 or at a collection pupil plane 132 (e.g., a diffraction plane) associated with an angular distribution of the sample light 110.

The collection sub-system 116 may include one or more optical elements suitable for modifying and/or conditioning the sample light 110 from the sample 108. In some embodiments, the collection sub-system 116 includes one or more collection lenses 134 (e.g., to collimate the sample light 110, to relay pupil and/or field planes, or the like), which may include, but are not required to include, the objective lens 128. In some embodiments, the collection sub-system 116 includes one or more collection control optics 136 to shape or otherwise control the sample light 110. For example, the collection control optics 136 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In some embodiments, the optical sub-system 102 includes a translation stage 138 to position the sample 108 with respect to the objective lens 128 during a measurement.

In some embodiments, the collection sub-system 116 includes two or more collection channels 140, each with at least one detector 112. For example, as illustrated in FIG. 1B, the optical sub-system 102 may include one or more beamsplitters 142 arranged to split the sample light 110 into the collection channels 140. Further, the beamsplitters 142 may be polarizing beamsplitters, non-polarizing beamsplitters, or a combination thereof.

Figure 2A:
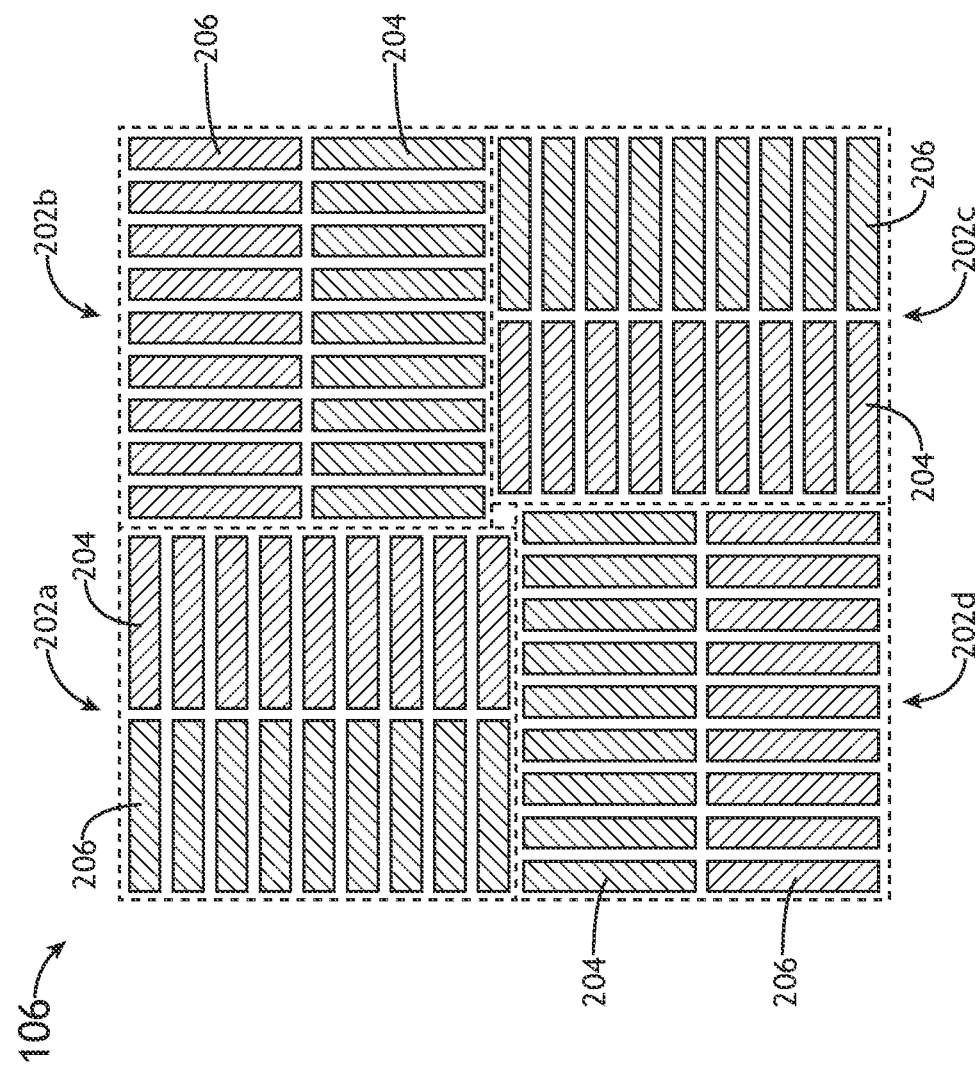
FIG. 2A is a top view of an overlay target with non-overlapping features, in accordance with one or more embodiments of the present disclosure.
Figure 2B:
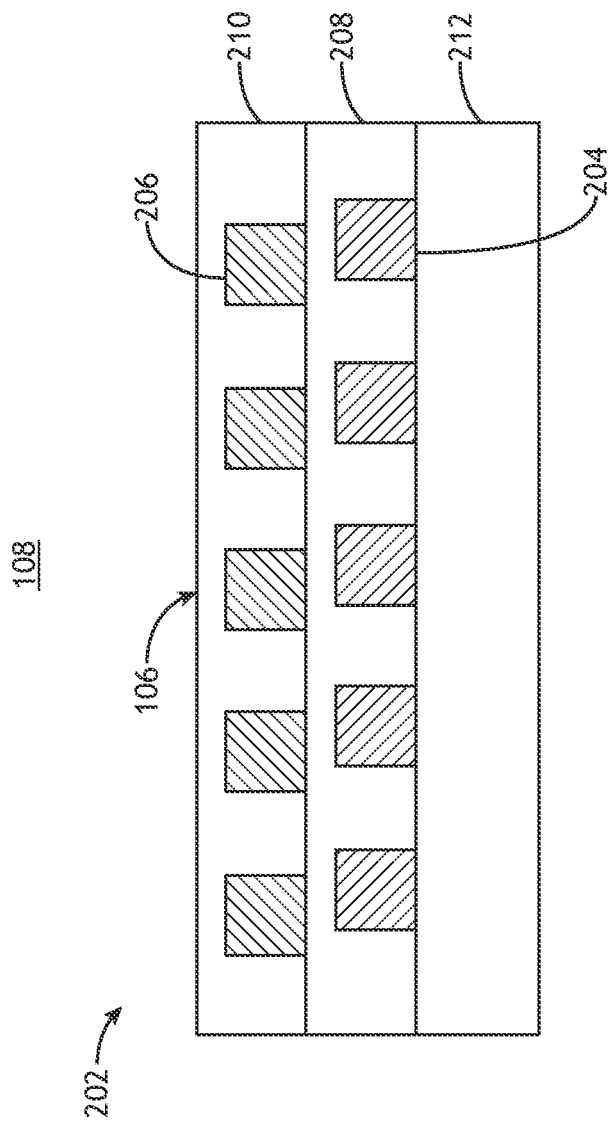
FIG. 2B is a simplified side view of a cell of an overlay target with overlapping features, in accordance with one or more embodiments of the present disclosure.

FIGS. 2A-2C depict non-limiting variations of the overlay target 106. In some embodiments, the overlay target 106 includes features associated with two or more lithographic exposures on one or more layers of the sample 108, where such features may be overlapping or non-overlapping.

FIG. 2A is a top view of an overlay target 106 with non-overlapping features, in accordance with one or more embodiments of the present disclosure. In one embodiment, the overlay target 106 includes four cells 202a-d, represented here as quadrants of the overlay target 106. Each cell 202a-d may include first target features 204 located on a first layer of the sample 108 and second target features 206 located on a second layer of the sample 108.

As illustrated in FIG. 2A, each cell 202 may include features having periodicity (e.g., a known pitch) along a measurement direction. For example, cell 202b and cell 202d may be configured to provide overlay measurements along the X direction as illustrated in FIG. 2A. An overlay measurement along the X direction may be made by directly comparing relative positions of the first target features 204 and the second target features 206 within each cell or between cell 202b and cell 202d. In another instance, an overlay measurement along the X direction may be made by comparing a point of symmetry (e.g., rotational symmetry, reflection symmetry, mirror symmetry, or the like) between first target features 204 distributed across cell 202b and cell 202d with a point of symmetry between second target features 206 distributed across cell 202b and cell 202d. Similarly, cell 202a and cell 202c may be configured to provide overlay measurements along the Y direction as illustrated in FIG. 2A.

It is to be understood, however, that FIG. 2A and the associated description is provided solely for illustrative purposes and should not be interpreted as limiting on the present disclosure. For example, an overlay target 106 may generally include any number of cells 202 that are distributed in any configuration suitable for measurements along one or more directions. By way of another example, the target features within any cell 202 are not limited to identical features distributed with a single pitch. In some embodiments, the target features are formed as a set of elements with two or more characteristic pitches. Such a structure may be functionally decomposed into two or more gratings with different pitches in a common area or layer on a sample 108. In some embodiments, the target features include sub-resolution features suitable for controlling the fabrication process. Further, the overlay target 106 may generally include any overlay target known in the art including, but not limited to, an advanced imaging metrology (AIM) target or a triple AIM target having target features on three layers. Additionally, the overlay target 106 may include target features on one or more sample layers and is thus not limited to multi-layer configurations as illustrated in FIG. 2A. In some embodiments, all target features are on a common layer to provide overlay between lithographic exposures on that layer (e.g., as a part of a double printing process).

FIG. 2B is a simplified side view of a cell 202 of an overlay target 106 with overlapping features, in accordance with one or more embodiments of the present disclosure. FIG. 2C is a simplified top view of the cell 202 in FIG. 2B, in accordance with one or more embodiments of the present disclosure. An overlay target 106 may generally have one or more cells 202 having overlapping features.

As depicted in FIGS. 2B-2C, the first target features 204 may include a first set of periodic features on a first sample layer 208 and the second target features 206 may correspond to second set of periodic features on a second sample layer 210. The first and second sample layers 208,210 may be fabricated on a substrate 212. Further, any number of intervening layers may be fabricated above, below, or between the first and second sample layers 208,210. Such a configuration may be referred to as a grating-over-grating structure and may generate diffraction orders associated with the first target features 204 and second target features 206 alone or in combination (e.g., double diffraction). In some embodiments, the first target features 204 and the second target features 206 have a common pitch (or periodicity more generally) as depicted in FIGS. 2B-2C such that diffraction orders from the first target features 204 and second target features 206 overlap and interfere. In some embodiments, though not shown, the first target features 204 and the second target features 206 may have different pitches (or periodicities more generally). Such a configuration may also be referred to as a Moiré structure. In this configuration, diffraction orders from the first target features 204 and the second target features 206 may have different angles and may partially overlap, though this is not a requirement. Such a structure may additionally generate Moiré diffraction (e.g., double diffraction) at different angles based on a difference between the pitches of the first target features 204 and the second target features 206.

The first target features 204 and/or the second target features 206 may generally have any periodic distribution along one or more directions and may thus be suitable for facilitating overlay measurements along one or more directions. For example, the first target features 204 and/or the second target features 206 may include a line/space pattern having any pitch or duty cycle along any direction. Further, any of the first target features 204 or the second target features 206 may be arranged with two or more characteristic pitches. As an illustration, any of the features may be segmented with a coarse pitch and a fine pitch.

The first target features 204 and the second target features 206 of any particular cell 202 may be, but are not required to be, intentionally offset along one or more measurement directions. For example, FIGS. 2B-2C illustrate a configuration with an intended offset of $f_0$. In some embodiments, the induced shift is at least an order of magnitude smaller than a size of the cell 202 (e.g., a length of the cell 202 in a direction of the intended offset).

Techniques for measuring an amplitude asymmetry of opposing diffraction orders from periodic target features of an overlay target 106 (e.g., first target features 204 and/or second target features 206 as depicted in FIGS. 2A-2C, or the like) are now described in greater detail, in accordance with one or more embodiments of the present disclosure.

As described previously herein, a physical asymmetry of features of an overlay target 106 (e.g., first target features 204 and/or second target features 206 as depicted in FIGS. 2A-2C, or the like) may generally lead to an amplitude asymmetry and/or a phase asymmetry of opposing diffraction orders (e.g., positive and negative diffraction orders of a given degree). Such a physical asymmetry may be, but is not required to be, in the form of non-orthogonal sidewalls on one or more sides of features of an overlay target 106.

As a non-limiting illustration in the case of image-based overlay techniques, a detector 112 used to image the overlay target 106 may be located at a collection field plane 130. In this configuration, an amplitude asymmetry of opposing diffraction orders used to generate such an image may lead to a reduction in contrast of the imaged features, while a phase asymmetry may impact an imaged location of the target features and may thus be indistinguishable from overlay.

Measurements of amplitude asymmetry may be useful for assessing the process compatibility of a particular design of the overlay target 106 as a quality metric indicative of the presence of target asymmetry (and thus potential measurement error) and/or for generating corrections of an overlay measurement to at least partially mitigate the fabrication of asymmetric overlay targets 106. In this way, the amplitude asymmetry may be used at least in part to generate feedback and/or feed-forward correctables for process equipment such as, but not limited to, lithography tools.

In some embodiments, amplitude asymmetry is measured by generating measurements of an overlay target 106 at two focal positions (e.g., positions of the sample 108 with respect to one or more components of the optical sub-system 102 such as, but not limited to, the objective lens 128).

It is contemplated herein that both the contrast of imaged features and a measured overlay value generated based on the images of the features may vary for different focal positions of the sample 108 when amplitude asymmetry is present. In particular, the following expressions may be true (at least with a selected tolerance) within a range of focal positions around a best contrast position ($F_0$) (e.g., a focal position at which contrast of imaged target features is at a maximum):

$$OVL_{Asym} \cong \frac{P}{2\pi} \cdot \tilde{e} \cdot \tan\left[\frac{2\pi(F - F_0)}{Z_T}\right] \quad (1)$$

$$\text{Contrast} \sim \cos\left[\frac{2\pi(F - F_0)}{Z_T}\right] \quad (2)$$

where F corresponds to a focal position of the sample 108, $Z_T$ is Talbot's distance, P is a pitch of the target features being imaged, e is the amplitude asymmetry, $OVL_{Asym}$ is a difference between overlay measurements taken based on images at focal distances F and $F_0$, and Contrast is a difference between the contrast of images of the target features at focal distances F and $F_0$.

The contrast of imaged target features may be defined using any suitable metric. In some embodiments, contrast may be defined as a difference between maximum and minimum image signal levels (e.g., pixel values, amplitudes, or the like) associated with imaged features. For example, the contrast may be defined as:

$$\text{Contrast} = A_{max} - A_{min}, \quad (3)$$

where $A_{max}$ is a maximum image signal level (e.g., amplitude) associated with the imaged features and $A_{min}$ is a minimum image signal level (e.g., amplitude) associated with the imaged features (e.g., a background level).

As another example, the contrast may be defined as:

$$\text{Contrast} = \frac{(A_{max} - A_{min})}{(A_{max} + A_{min})}. \quad (4)$$

As another example, the contrast may be defined as:

$$\text{Contrast} = \frac{\text{var}(A)}{\text{mean}(A)} = \frac{(A_{max} - A_{min})}{\frac{1}{2} \cdot (A_{max} + A_{min})}. \quad (5)$$

Such definitions in Equations (4) and (5) may normalize the contrast value, which may facilitate comparison of the contrast measured in different images. It is to be understood that the spirit and scope of the present disclosure may extend to any suitable definition of image contrast.

It is further contemplated herein that the range of focal distances for which Equations (1) and (2) are valid may depend on the properties of the illumination 104 used to generate the images, where these properties may be selected as part of a metrology recipe. In particular, this range may generally increase as the numerical aperture (NA) of the illumination 104 decreases. As an illustration using visible light, Equations (1) and (2) may be valid (at least within a selected tolerance) over a range of approximately 1 micrometer (μm) around the best contrast position ($F_0$) when using illumination 104 with a NA≤0.2. However, this example is provided purely for illustrative purposes and should not be interpreted as limiting. Rather, the illumination 104 may be selected to have any parameters suitable for providing that Equations (1) and (2) are valid within a selected tolerance for any selected range of focal positions.

The value of the amplitude asymmetry E may be determined using measurements of $OVL_{Asym}$ and Contrast based on Equations (1) and (2) using images taken at two focal positions (e.g., values of F corresponding to $F_1$ and $F_2$).

However, it may be the case that the best contrast position ($F_0$) may not be readily known or may not be practical to ascertain. In such cases, the amplitude asymmetry may be determined based on measured center of symmetry positions (CSPs) using the following equations:

$$CSP_1 - CSP_2 = \frac{P}{2\pi} \cdot \tilde{e} \cdot \left\{\tan\left[\frac{2\pi(F_1 - F_0)}{Z_T}\right] - \tan\left[\frac{2\pi(F_2 - F_0)}{Z_T}\right]\right\} \quad (6)$$

$$\frac{\text{Contrast}_1}{\text{Contrast}_2} = \frac{\cos\left[\frac{2\pi(F_1 - F_0)}{Z_T}\right]}{\cos\left[\frac{2\pi(F_2 - F_0)}{Z_T}\right]} \quad (7)$$

where $F_1$ and $F_2$ are different known sample focal positions and subscripts refer to the corresponding images. As one illustration, $CSP_1$ may correspond to a center of symmetry position of the first target features 204 measured in a first image at focal position $F_1$, whereas $CSP_2$ may correspond to a center of symmetry position of the first target features 204 measured in a second image at focal position $F_2$. As another illustration, $CSP_1$ may correspond to a center of symmetry position of the second target features 206 measured in a first image at focal position $F_1$, whereas $CSP_2$ may correspond to a center of symmetry position of the second target features 206 measured in a second image at focal position $F_2$. Similarly, $\text{Contrast}_1$ and $\text{Contrast}_2$ may correspond to contrast values of either the first target features 204, the second target features 206, or features at a Moiré pitch as provided in images generated at focal positions $F_1$ and $F_2$, respectively.

As a result, both the amplitude asymmetry E and the best contrast position $F_0$ may be determined based on Equations (6) and (7) using images at focal positions $F_1$ and $F_2$.

It is contemplated herein that measurements of the center of symmetry positions of target features between two different images may require that the associated images be aligned to each other. The optical sub-system 102 may align the images taken at the different focal positions using any technique known in the art. In some embodiments, the optical sub-system 102 includes target projectors to project one or more patterns on the images that may operate as absolute reference points for image alignment. Target projectors are generally described in U.S. Pat. No. 10,677,588 issued on Jun. 9, 2020, which is incorporated herein by reference in its entirety.

Referring back to FIG. 1B, the images used to calculate the value of the amplitude asymmetry (e.g., images at $F_1$ and $F_2$) may be generated using various techniques. In some embodiments, the images are generated simultaneously in two or more collection channels 140 (e.g., as illustrated in FIG. 1B). For example, the optical sub-system 102 may include various optical elements (e.g., collection control optics 136, collection lenses 134, or the like) to provide that images in different collection channels 140 correspond to different focal positions. In this way, different images at different depths may be generated simultaneously without requiring motion of the metrology system 100. In some embodiments, the images are generated sequentially (e.g., in a single collection channel 140) where the sample 108 is repositioned between measurements to change the focal position.

It is further contemplated herein that, in addition to determining a value of the amplitude asymmetry, Equations (1)-(4) may facilitate the generation of one or more overlay measurements. For example, overlay measurements at any focal position (F) may be generated using any suitable overlay technique based on the relative positions of the imaged features. Further, the impact of the amplitude asymmetry e on an overlay measurement may be removed or eliminated based on Equation (1).

In some embodiments, amplitude asymmetry is measured based on a first image of an overlay target 106 constructed using one or more positive diffraction orders from associated target features and a second image of the overlay target 106 constructed using one or more negative diffraction orders from the associated target features, where the first and second images are generated at a common focal position. As one non-limiting illustration, the first image may be constructed using +1 order diffraction and 0-order diffraction (e.g., specular reflection), while the second image may be constructed using −1 order diffraction and the 0-order diffraction.

In this configuration, an overlay measurement may be generated based on a half sum (or average) between overlay determined based on the first and second images separately. Such a technique may cancel any contribution of amplitude asymmetry to generate a corrected overlay measurement ($OVL_{corr}$). For example, this corrected overlay measurement may be generated based on:

$$OVL_{corr} = \frac{OVL_1 + OVL_2}{2}, \quad (8)$$

where $OVL_1$ and $OVL_2$ are overlay measurements generated using the first and second images, respectively.

Further, the value of the amplitude asymmetry may be determined from the first and second images using multiple techniques.

In some embodiments, the value of the amplitude asymmetry may be determined based on signal amplitudes of imaged target features in the first and second images. For example, the amplitude asymmetry may be related to such signal amplitudes by:

$$\tilde{e} = \frac{A_1 - A_2}{A_1 + A_2}, \quad (9)$$

where $A_1$ and $A_2$ are signal amplitudes of imaged target features in the first and second images, respectively. As an illustration, $A_1$ and $A_2$ may correspond to the peak (or maximum) imaged amplitudes of the first target features 204 in the first and second images, respectively. As another illustration, $A_1$ and $A_2$ may correspond to the imaged amplitudes of the second target features 206 in the first and second images, respectively.

In some embodiments, the value of the amplitude asymmetry may be determined based on contrast measurements (e.g., as defined in Equations (3)-(5) or by any other suitable metric). For example, the value of the amplitude asymmetry may be determined based on the following expression:

$$\tilde{e} = \frac{\text{var}(A_{Img,1})}{\text{mean}(A_{Img,1})} - \frac{\text{var}(A_{Img,2})}{\text{mean}(A_{Img,2})}, \quad (10)$$

where $$\frac{\text{var}(A_{Img,1})}{\text{mean}(A_{Img,1})}$$

corresponds to a measured contrast of imaged periodic features (e.g., first target features 204, second target features 206, or images of a Moiré pitch associated with double diffraction) in the first image and $$\frac{\text{var}(A_{Img,2})}{\text{mean}(A_{Img,2})}$$

corresponds to a measured contrast of the same imaged periodic features in the second image.

It is contemplated herein that unlike center of symmetry position measurements, such image amplitude measurements may not require alignment of the first and second images. Further, in applications utilizing multiple illumination beams, the use of contrast to measure the amplitude symmetry (e.g., using Equation (10)), may eliminate the effect of differing intensities of these illumination beams.

It is further contemplated herein that the Equations (8)-(10) may be used with first and second images of the overlay target 106 based on opposing diffraction orders from a wide range of target designs and from a wide range of imaging configurations (e.g., metrology recipes).

Referring now to FIGS. 3-22, various non-limiting configurations of the optical sub-system 102 suitable for measuring amplitude asymmetry using Equations (8)-(10) are described in greater detail, in accordance with one or more embodiments of the present disclosure. In particular, FIGS. 3-22 depict a distribution of illumination 104 in an illumination pupil plane 122 and distributions of sample light 110 in collection pupil planes 132 used to construct a first image 302 ("Image 1") using one or more positive diffraction orders and a second image 304 ("Image 2") using one or more negative diffraction orders. Although not explicitly shown, the first image 302 and the second image 304 may be generated by one or more detectors 112 in a collection field plane 130 based on the corresponding distribution of sample light 110. In this way, the diffraction orders depicted in the collection pupil planes 132 in FIGS. 3-22 associated with the first image 302 and the second image 304 may correspond to light used to form the respective images and not a depiction of the images themselves. For example, FIGS. 3-22 depict illumination 104 in the form of one or more illumination beams within an illumination pupil boundary 306 and sample light 110 in the form of diffraction orders of the illumination 104 within a collection pupil boundary 308. Further, the various diffraction orders are labeled with the diffraction order and direction of diffraction. As an illustration, a diffraction lobe labeled +1x corresponds to positive first-order diffraction along an X direction (e.g., by target features that are periodic along the X direction), a diffraction lobe labeled −1x corresponds to negative first-order diffraction along an X direction, a diffraction lobe labeled +1y corresponds to positive first-order diffraction along a Y direction, a diffraction lobe labeled −1y corresponds to negative first-order diffraction along a Y direction, and so on.

Importantly, FIGS. 3-22 depict only diffraction orders of interest in a particular configuration and do not necessarily depict all collected diffraction orders present. For example, undesired diffraction orders may be blocked prior to reaching the one or more detectors 112 or otherwise not collected.

Further, the first image 302 and the second image 304 may be generated simultaneously (e.g., in different collection channels 140) or sequentially (e.g., in a single collection channel 140). Further, the configurations of the illumination 104 and/or the sample light 110 in FIGS. 3-22 may be generated in accordance with a metrology recipe. In this way, the optical sub-system 102 may include any suitable optical elements in the illumination sub-system 114 or the collection sub-system 116 suitable for generating the depicted configurations.

FIGS. 3-7 depict various non-limiting configurations for measurement of amplitude asymmetry based on axial illumination 104 with a single illumination beam at a normal incidence angle.

FIG. 3 depicts illumination and collection conditions suitable for amplitude asymmetry measurements based on bright-field imaging of one-dimensional overlay targets 106 with axial illumination 104, in accordance with one or more embodiments of the present disclosure. The configuration of FIG. 3 may be suitable for an overlay target 106 with non-overlapping features (e.g., as illustrated in FIG. 2A) suitable for an overlay measurement along a single direction.

In particular, FIG. 3 depicts axial illumination 104 for both the first image 302 and the second image 304. FIG. 3 also depicts a set of collection pupil planes 132 for X-direction collection that may be associated with a one-dimensional overlay target 106 having periodic features along the X direction along with a set of collection pupil planes 132 for Y-direction collection that may be associated with a one-dimensional overlay target 106 having periodic features along the Y direction. In either case, the collection pupil plane 132 for generating the first image 302 includes positive first-order diffraction lobe and a zero-order diffraction lobe (e.g., specular reflection), whereas the collection pupil plane 132 for generating the second image 304 may include a negative first-order diffraction lobe and a zero-order diffraction lobe.

Figure 4:
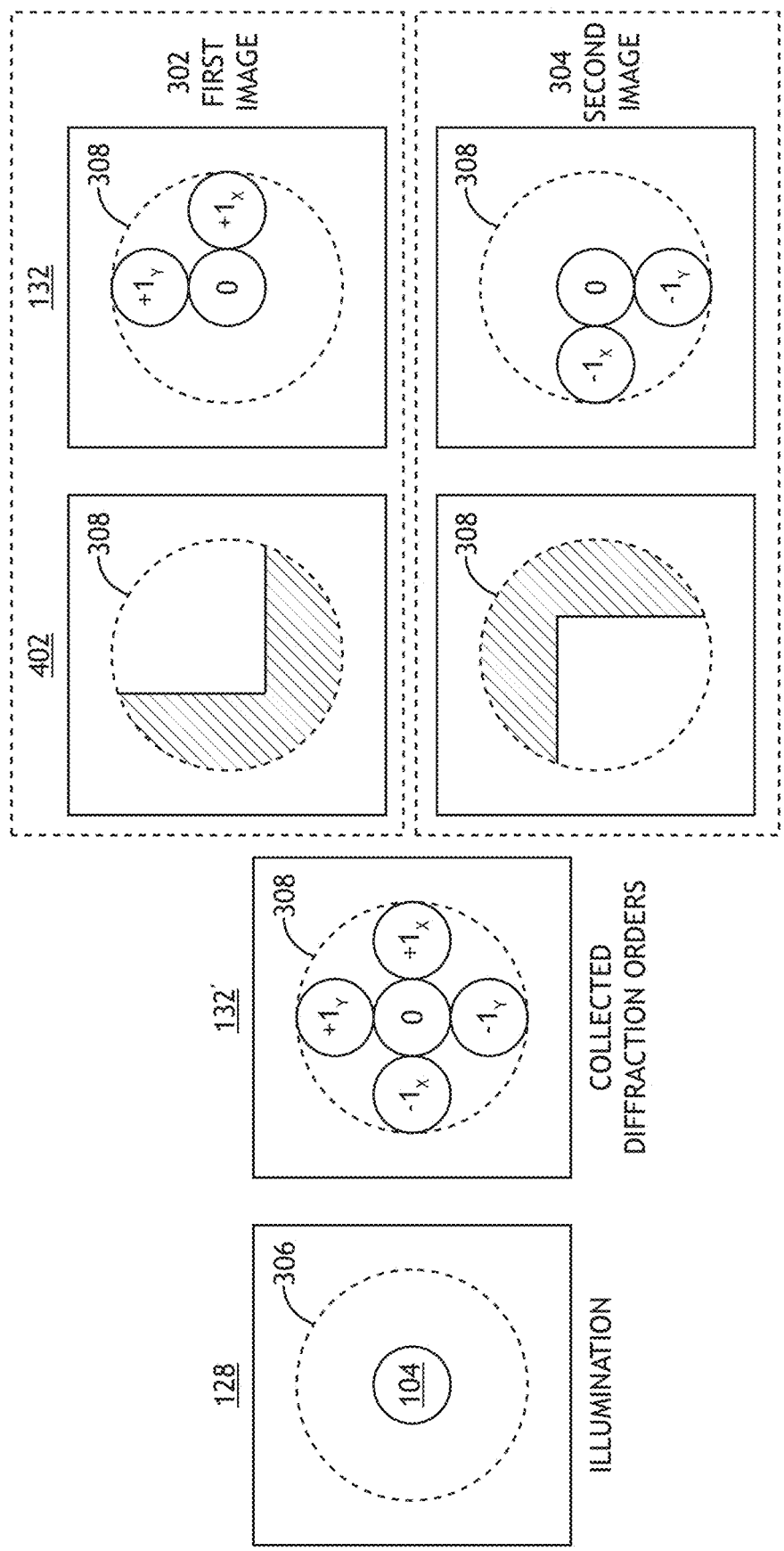
FIG. 4 depicts illumination and collection conditions suitable for amplitude asymmetry measurements based on bright-field imaging of a two-dimensional overlay target with axial illumination, in accordance with one or more embodiments of the present disclosure.

FIG. 4 depicts illumination and collection conditions suitable for amplitude asymmetry measurements based on bright-field imaging of a two-dimensional overlay target 106 with axial illumination 104, in accordance with one or more embodiments of the present disclosure. The configuration of FIG. 4 may be suitable for an overlay target 106 with non-overlapping features (e.g., as illustrated in FIG. 2A) suitable for an overlay measurement along two directions. Further, the configuration of FIG. 4 may be suitable for a configuration of the optical sub-system 102 with two collection channels 140 (e.g., as illustrated in FIG. 1B) for simultaneous generation of the first image 302 and the second image 304.

In particular, FIG. 4 depicts a collected collection pupil plane 132' including a distribution of light collected by the objective lens 128 along with apertures 402 (e.g., collection control optics 136) for each collection channel 140 to generate the desired distributions of sample light 110 in the collection pupil planes 132 to generate the first image 302 and the second image 304. For example, an aperture 402 for a first collection channel 140 may selectively pass positive first-order diffraction lobes along the X and Y directions to generate the first image 302, whereas an aperture 402 for a second collection channel 140 may selectively pass negative first-order diffraction lobes along the X and Y directions to generate the second image 304.

Figure 5A:
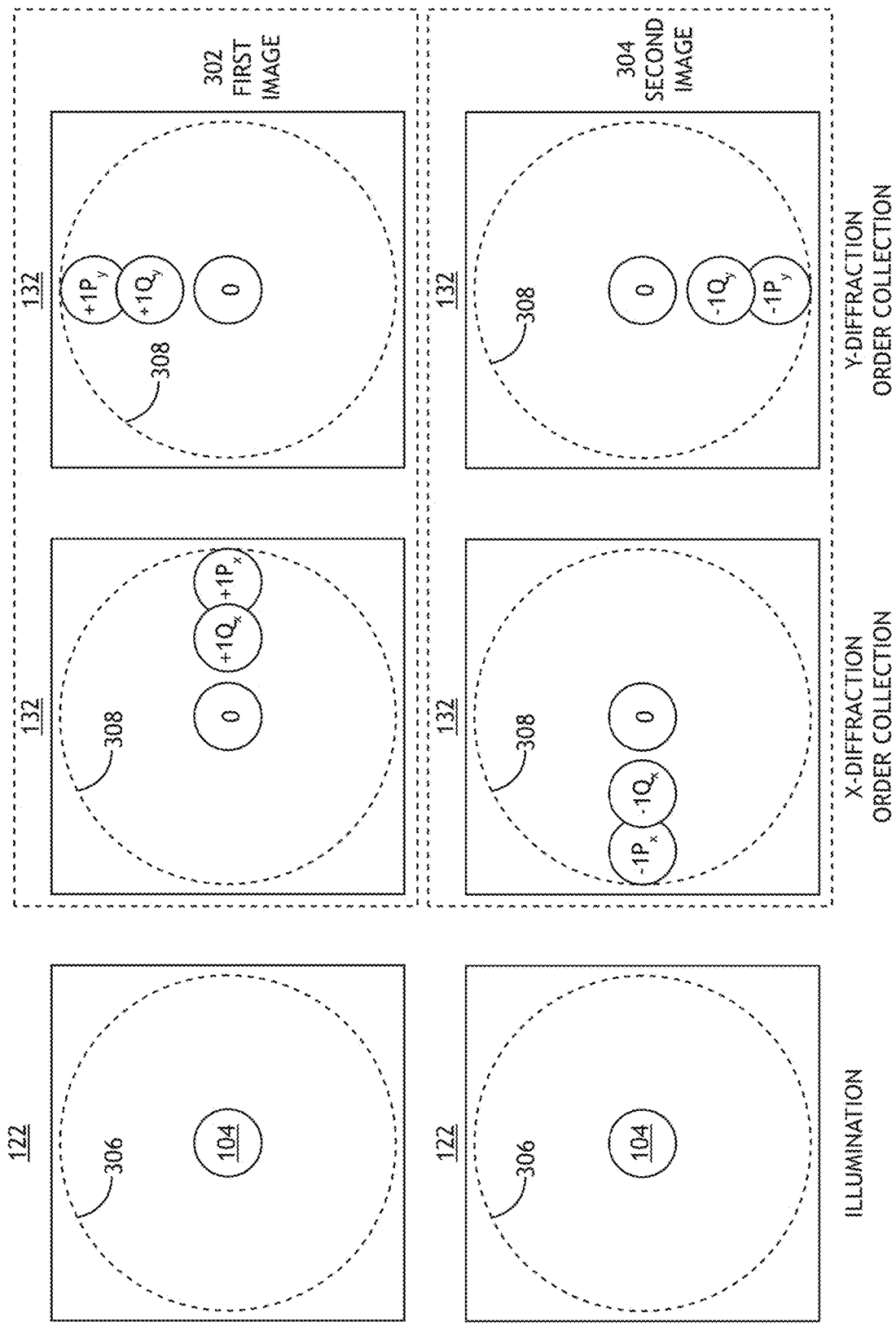
FIG. 5A depicts illumination and collection conditions suitable for amplitude asymmetry measurements based on bright-field imaging of one-dimensional overlay targets 106 with overlapping periodic structures with different periods using axial illumination, in accordance with one or more embodiments of the present disclosure.

FIG. 5A depicts illumination and collection conditions suitable for amplitude asymmetry measurements based on bright-field imaging of one-dimensional overlay targets 106 with overlapping periodic structures with different periods (e.g., as illustrated in FIGS. 2B-2C) using axial illumination 104, in accordance with one or more embodiments of the present disclosure. For example, such an overlay target 106 may include first target features 204 with a first pitch (P) and second target features 206 with a second pitch (Q) (or vice versa). Such an overlay target 106 may be referred to as a robust AIM (r-AIM) target.

In particular, FIG. 5A depicts axial illumination 104 for both the first image 302 and the second image 304. FIG. 5A also depicts a set of collection pupil planes 132 for X-direction collection that may be associated with a one-dimensional overlay target 106 having periodic features along the X direction along with a set of collection pupil planes 132 for Y-direction collection that may be associated with a one-dimensional overlay target 106 having periodic features along the Y direction. In either case, the collection pupil plane 132 for generating the first image 302 includes positive first-order diffraction lobes for pitches P and Q (+1Px and +1Qx) and a zero-order diffraction lobe (e.g., specular reflection), whereas the collection pupil plane 132 for generating the second image 304 may include negative first-order diffraction lobes for pitches P and Q (−1 Px and −1 Qx) and a zero-order diffraction lobe. Since diffraction lobes associated with pitches P and Q are within the collection pupil boundary 308, both pitches may be resolved in the first image 302 and the second image 304.

Figure 5B:
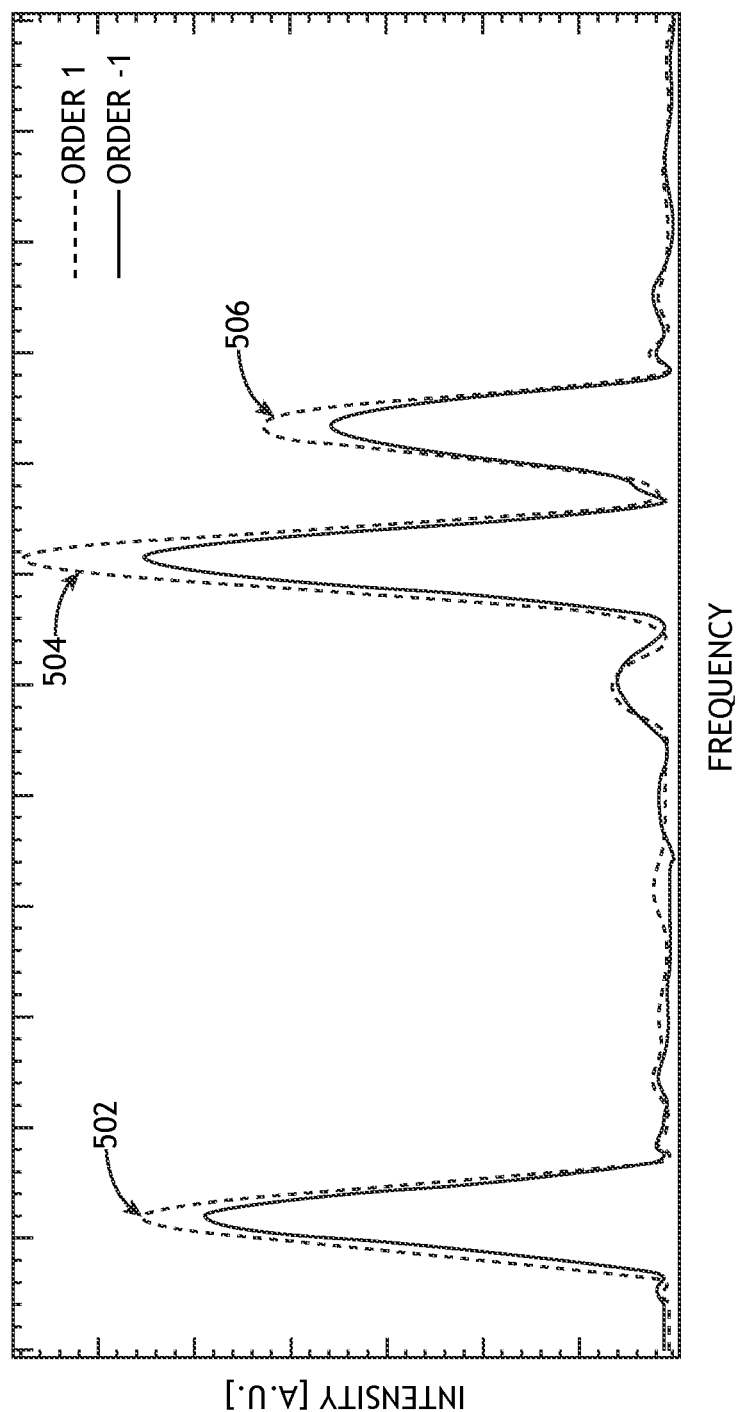
FIG. 5B is plot of spatial frequencies in the first image and the second image from a fully resolved r-AIM target, in accordance with one or more embodiments of the present disclosure.

It is noted that double-diffraction lobes (e.g., double diffraction from both the first target features 204 and the second target features 206) may also be collected, but are not shown in FIG. 5A for clarity. In some embodiments, such double-diffraction lobes are blocked (e.g., by an aperture) to prevent a Moiré pattern from being visible on the first image 302 and the second image 304. In some embodiments, such double-diffraction lobes contribute to the formation of the first image 302 and second image 304. In this configuration, the Moiré pattern may be ignored or removed (e.g., by spatial frequency filtering techniques). FIG. 5B is plot of spatial frequencies in the first image 302 and the second image 304 from a fully resolved r-AIM target, in accordance with one or more embodiments of the present disclosure. In FIG. 5B, a double-diffraction peak 502 is visible along with peaks 504,506 associated with positive first-order diffraction lobes for pitches P and Q. Accordingly, the double-diffraction peak 502 may be filtered using spatial frequency-based filtering techniques. Further, amplitude asymmetry is manifested as differences between the maximum amplitudes of peaks 504,506. It is further contemplated herein that the peaks 504,506 may not contain information associated with an overlay measurement. In some embodiments, the double-diffraction peak 502 may be used to calculate overlay. In this way, such a measurement may be used for multiple purposes.

Figure 6:
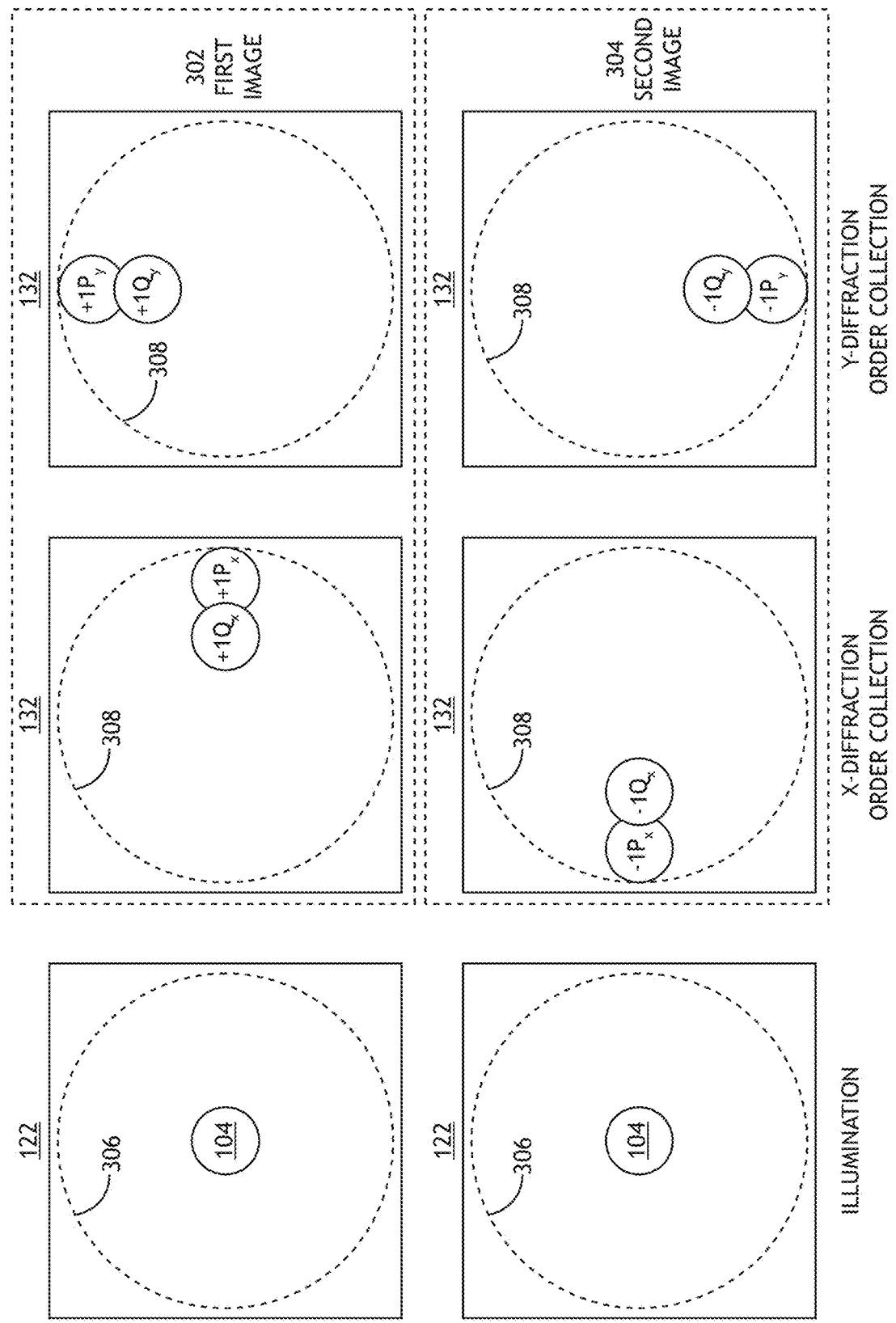
FIG. 6 depicts illumination and collection conditions suitable for amplitude asymmetry measurements based on dark-field imaging of one-dimensional overlay targets with overlapping periodic structures with different periods using axial illumination, in accordance with one or more embodiments of the present disclosure.

FIG. 6 depicts illumination and collection conditions suitable for amplitude asymmetry measurements based on dark-field imaging of one-dimensional overlay targets 106 with overlapping periodic structures with different periods (e.g., as illustrated in FIGS. 2B-2C) using axial illumination 104, in accordance with one or more embodiments of the present disclosure. FIG. 6 is substantially similar to FIG. 5A, except that 0-order diffraction lobes are blocked to provide dark-field imaging. In this configuration, only a Moiré pitch is resolved based on interference between the diffraction lobes for pitches P and Q.

Figure 7:
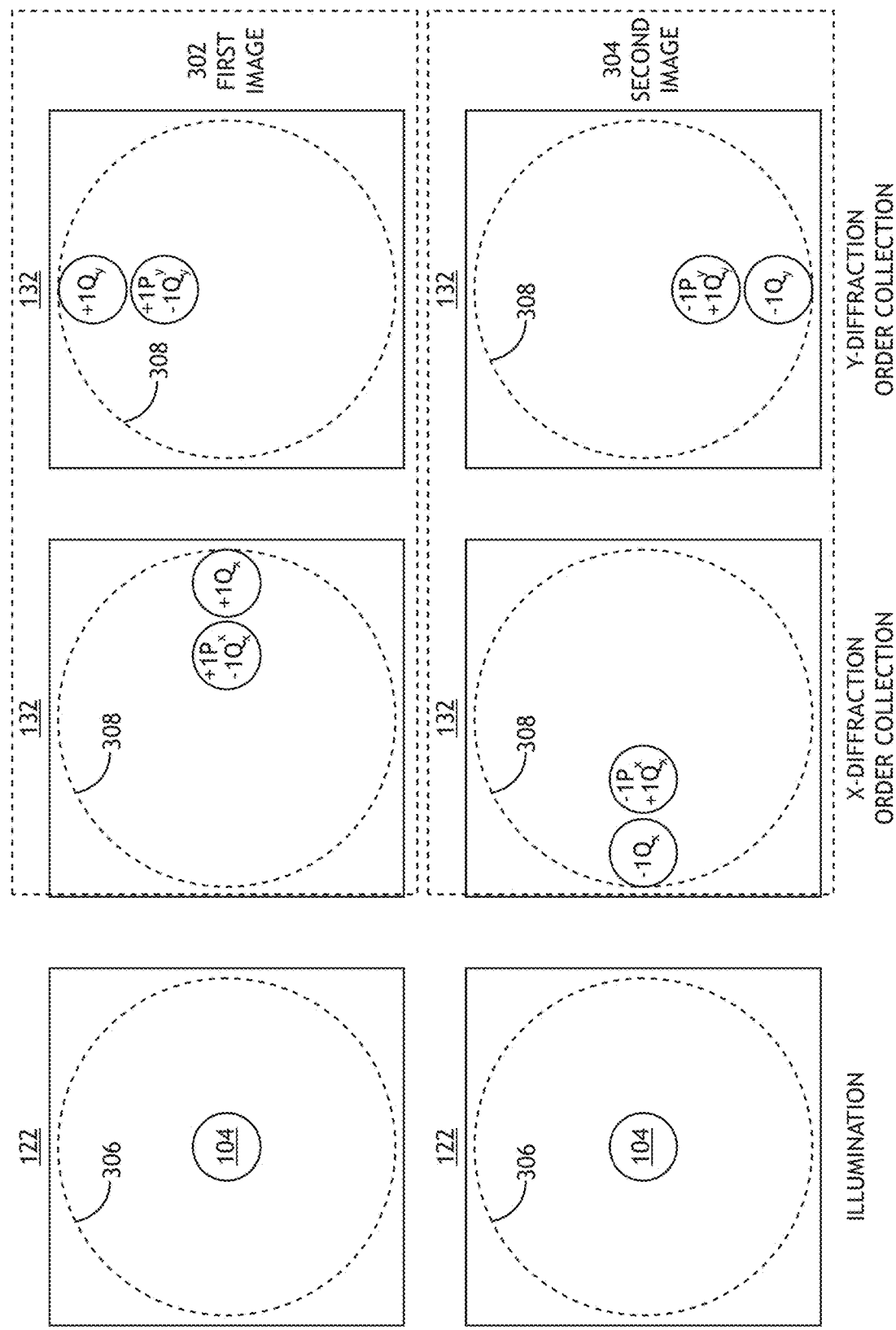
FIG. 7 depicts illumination and collection conditions suitable for amplitude asymmetry measurements based on dark-field imaging of one-dimensional overlay targets with overlapping periodic structures with different periods using axial illumination, in accordance with one or more embodiments of the present disclosure.

FIG. 7 depicts illumination and collection conditions suitable for amplitude asymmetry measurements based on dark-field imaging of one-dimensional overlay targets 106 with overlapping periodic structures with different periods (e.g., as illustrated in FIGS. 2B-2C) using axial illumination 104, in accordance with one or more embodiments of the present disclosure. FIG. 7 is substantially similar to FIG. 6, except that target features with a pitch P are unresolved. In particular, the collection pupil plane 132 for generating the first image 302 includes a positive first-order diffraction lobe for pitch Q (+1Qx) and a double-diffraction lobe (+1 Px, −1Qx), whereas the collection pupil plane 132 for generating the second image 304 may include a negative first-order diffraction lobe for pitch Q (+1Qx) and a double-diffraction lobe (−1Px, +1 Qx). Such a configuration may provide a partially-resolved image of the r-AIM target.

FIGS. 8-16 depict various non-limiting configurations for measurement of amplitude asymmetry based on illumination 104 with rotated dipoles including off-axis illumination beams (e.g., one or more beams of illumination 104 incident at an oblique incidence angle). In FIGS. 8-16, subscripts x and y (e.g., 104$_x$ and 104$_y$) are used to depict an illumination beam and/or a diffraction order associated with a certain direction (e.g., x or y directions, which are depicted as horizontal and vertical directions in the figures, respectively). Further, a prime (') is used to depict additional beams of illumination and/or associated diffraction orders in some embodiments utilizing multiple beams of illumination 104.

Figure 8:
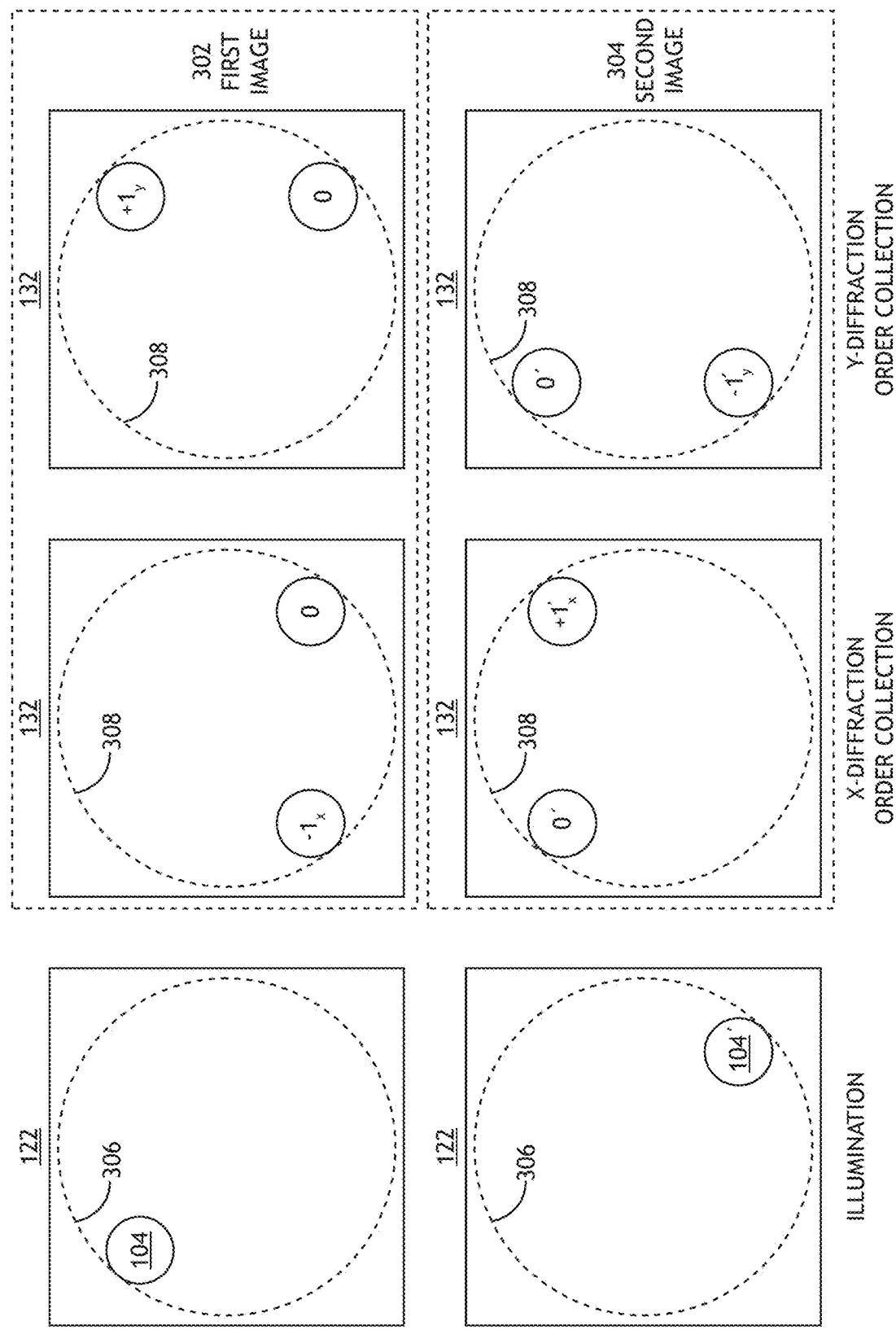
FIG. 8 depicts illumination and collection conditions suitable for amplitude asymmetry measurements based on bright-field imaging of one-dimensional overlay targets with rotated off-axis illumination, in accordance with one or more embodiments of the present disclosure.

FIG. 8 depicts illumination and collection conditions suitable for amplitude asymmetry measurements based on bright-field imaging of one-dimensional overlay targets 106 with rotated off-axis illumination 104, in accordance with one or more embodiments of the present disclosure. The configuration of FIG. 8 is similar to FIG. 3, except for the positions of the illumination beams and the associated diffraction orders. However, the configuration of FIG. 8 may enable the use of smaller pitches on the overlay target 106 and a correspondingly smaller size of the overlay target 106. Further, the first image 302 and the second image 304 are each based on a single beam of illumination 104.

Figure 9:
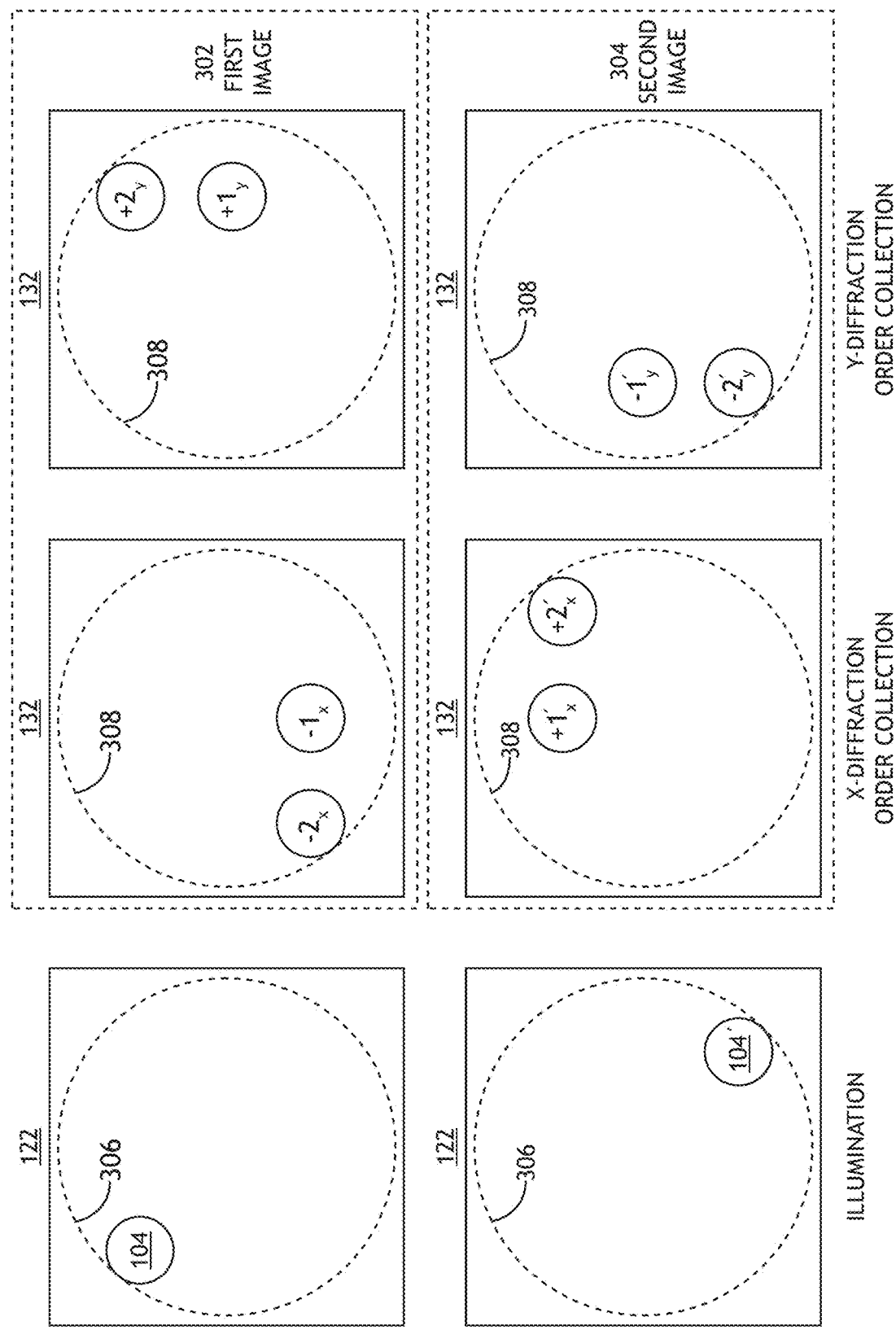
FIG. 9 depicts first illumination and collection conditions suitable for amplitude asymmetry measurements based on dark-field imaging of one-dimensional overlay targets with non-overlapping periodic structures using rotated off-axis illumination, in accordance with one or more embodiments of the present disclosure.

FIG. 9 depicts first illumination and collection conditions suitable for amplitude asymmetry measurements based on dark-field imaging of one-dimensional overlay targets 106 with non-overlapping periodic structures using rotated off-axis illumination 104, in accordance with one or more embodiments of the present disclosure. The configuration of FIG. 9 may be suitable for an overlay target 106 with non-overlapping features (e.g., as illustrated in FIG. 2A) suitable for an overlay measurement along a single direction. In FIG. 9, the collection pupil plane 132 for generating the first image 302 includes positive first and second order diffraction lobes, whereas the collection pupil plane 132 for generating the second image 304 includes negative first and second-order diffraction lobes. Such a configuration may be achieved through sequential illumination of the sample 108 with opposing lobes of off-axis illumination 104.

Figure 10:
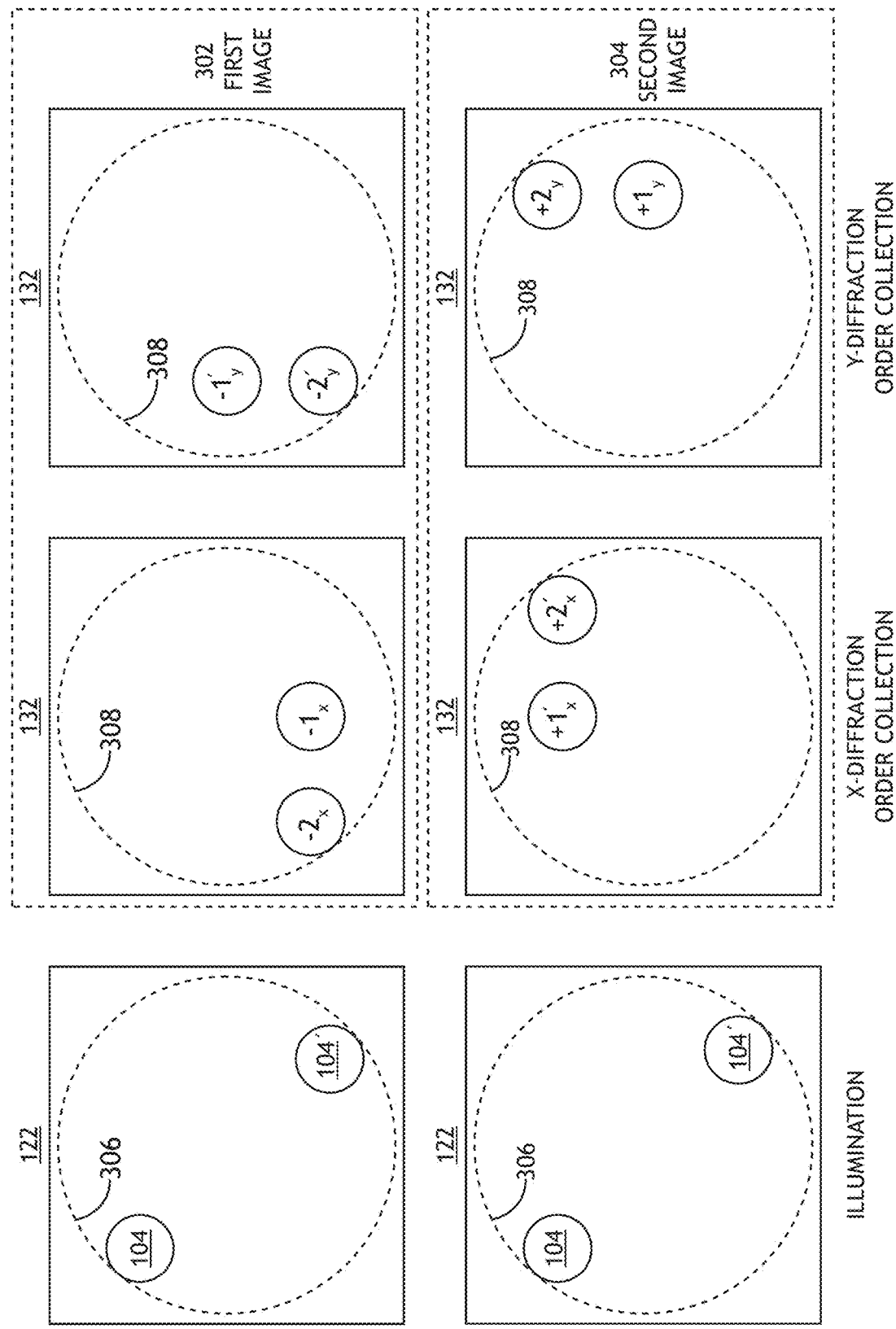
FIG. 10 depicts second illumination and collection conditions suitable for amplitude asymmetry measurements based on dark-field imaging of one-dimensional overlay targets with non-overlapping periodic structures using rotated dipole illumination, in accordance with one or more embodiments of the present disclosure.

FIG. 10 depicts second illumination and collection conditions suitable for amplitude asymmetry measurements based on dark-field imaging of one-dimensional overlay targets 106 with non-overlapping periodic structures using rotated dipole illumination 104, in accordance with one or more embodiments of the present disclosure. The configuration of FIG. 10 is similar to that of FIG. 9, except that first image 302 and the second image 304 are each generated with diffraction lobes from two beams of illumination 104. Such a configuration may be achieved through simultaneous illumination of the sample 108 with opposing lobes of off-axis illumination 104 coupled with pupil-based filtering techniques (e.g., as illustrated in FIG. 4) to pass the diffraction lobes of interest.

Figure 11:
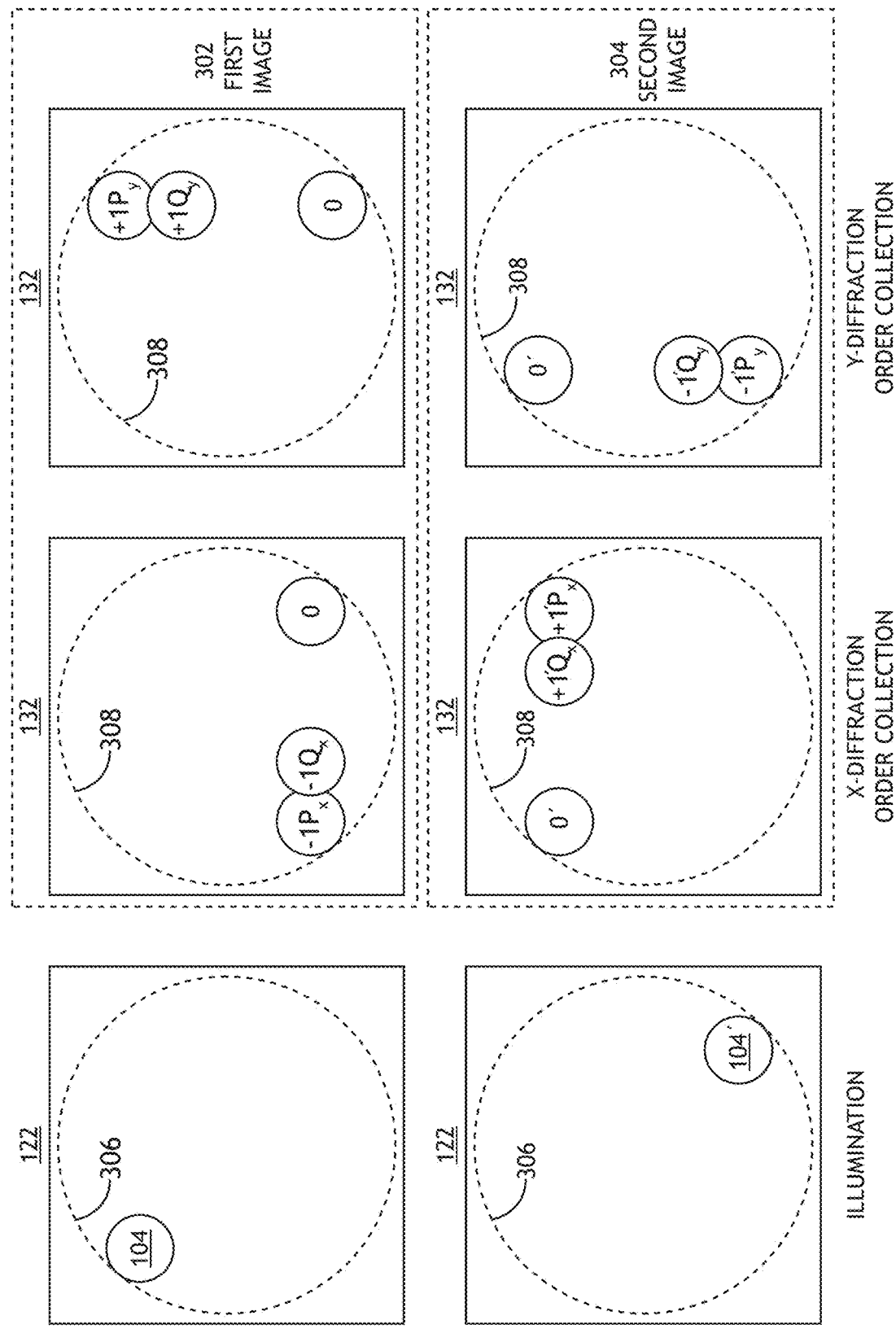
FIG. 11 depicts illumination and collection conditions suitable for amplitude asymmetry measurements based on bright-field imaging of one-dimensional overlay targets with overlapping periodic structures with different periods using rotated off-axis illumination, in accordance with one or more embodiments of the present disclosure.

FIG. 11 depicts illumination and collection conditions suitable for amplitude asymmetry measurements based on bright-field imaging of one-dimensional overlay targets 106 with overlapping periodic structures with different periods (e.g., as illustrated in FIGS. 2B-2C) using rotated off-axis illumination 104, in accordance with one or more embodiments of the present disclosure. The configuration of FIG. 11 is similar to FIG. 5A, except for the positions of the illumination beams and the associated diffraction orders.

Figure 12:
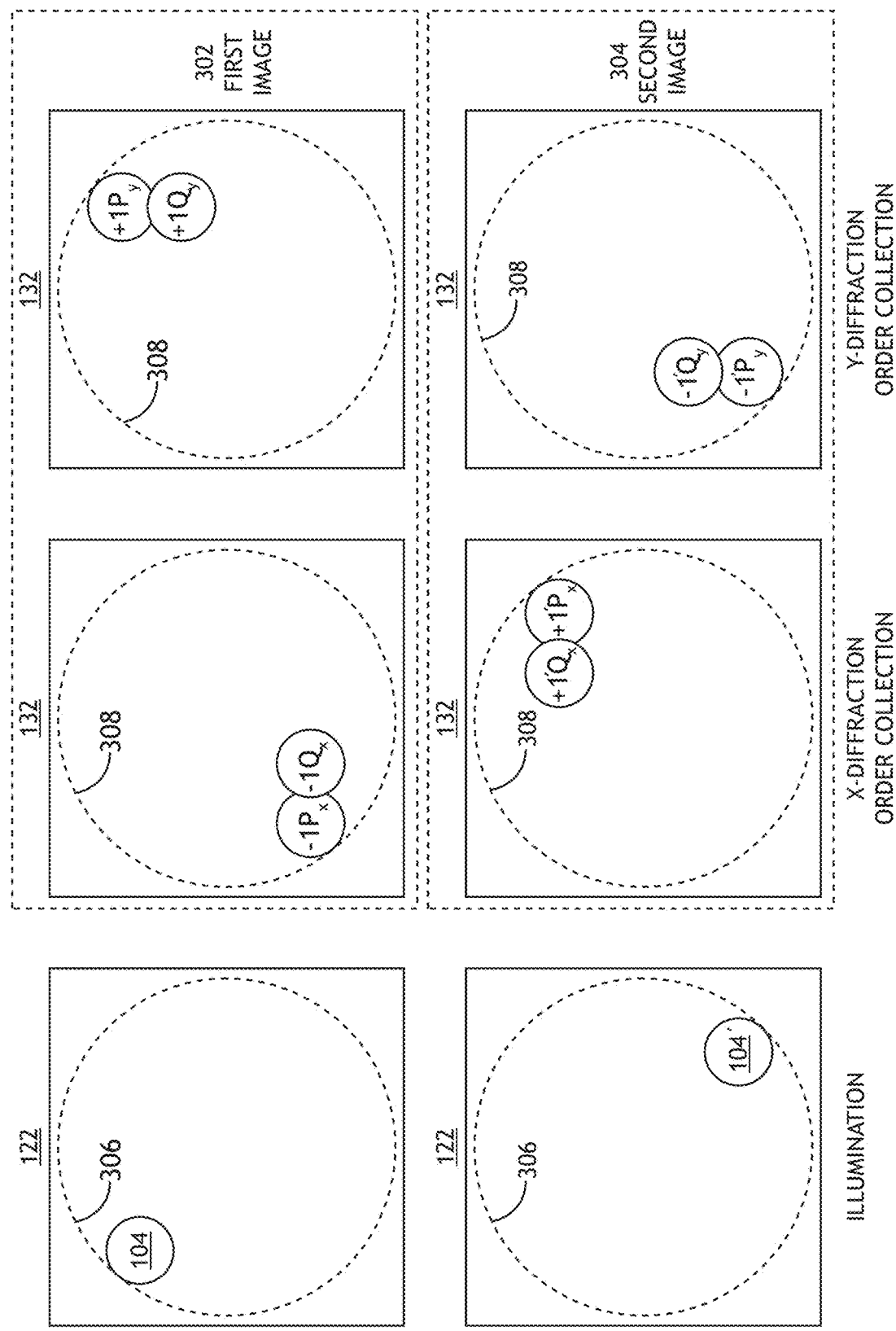
FIG. 12 depicts first illumination and collection conditions suitable for amplitude asymmetry measurements based on dark-field imaging of one-dimensional overlay targets with overlapping periodic structures with different periods using rotated off-axis illumination, in accordance with one or more embodiments of the present disclosure.

FIG. 12 depicts first illumination and collection conditions suitable for amplitude asymmetry measurements based on dark-field imaging of one-dimensional overlay targets 106 with overlapping periodic structures with different periods (e.g., as illustrated in FIGS. 2B-2C) using rotated off-axis illumination 104, in accordance with one or more embodiments of the present disclosure. The configuration of FIG. 12 is similar to FIG. 6, except for the positions of the illumination beams and the associated diffraction orders. Such a configuration may be achieved through sequential illumination of the sample 108 with opposing lobes of off-axis illumination 104.

Figure 13:
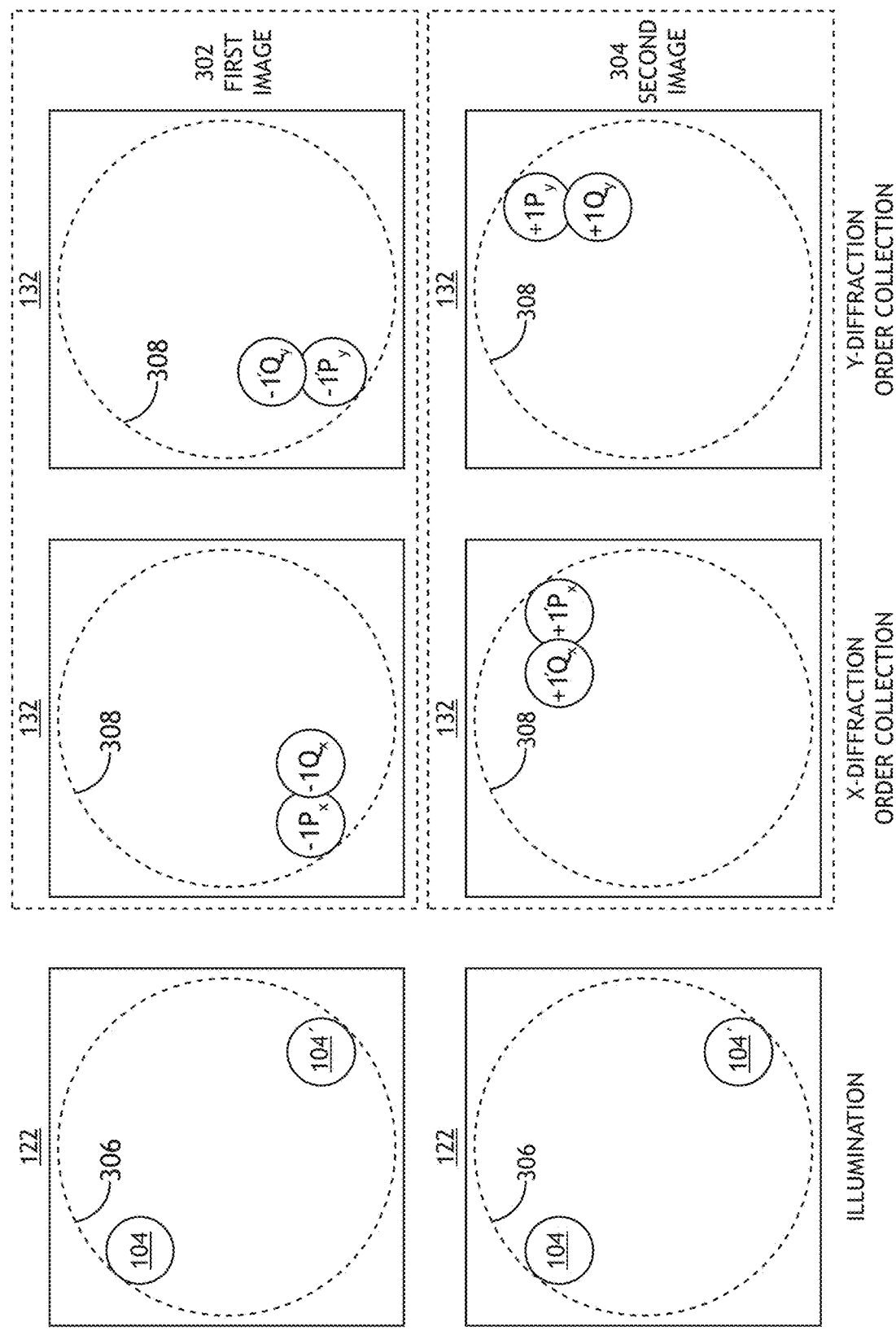
FIG. 13 depicts second illumination and collection conditions suitable for amplitude asymmetry measurements based on dark-field imaging of one-dimensional overlay targets with overlapping periodic structures with different periods using rotated dipole illumination, in accordance with one or more embodiments of the present disclosure.

FIG. 13 depicts second illumination and collection conditions suitable for amplitude asymmetry measurements based on dark-field imaging of one-dimensional overlay targets 106 with overlapping periodic structures with different periods (e.g., as illustrated in FIGS. 2B-2C) using rotated dipole illumination 104, in accordance with one or more embodiments of the present disclosure. The configuration of FIG. 13 is similar to FIG. 12, except for use of rotated dipole illumination 104 instead of a single beam of illumination 104. Such a configuration may be achieved through simultaneous illumination of the sample 108 with opposing lobes of off-axis illumination 104 coupled with pupil-based filtering techniques (e.g., as illustrated in FIG. 4) to pass the diffraction lobes of interest.

Figure 14:
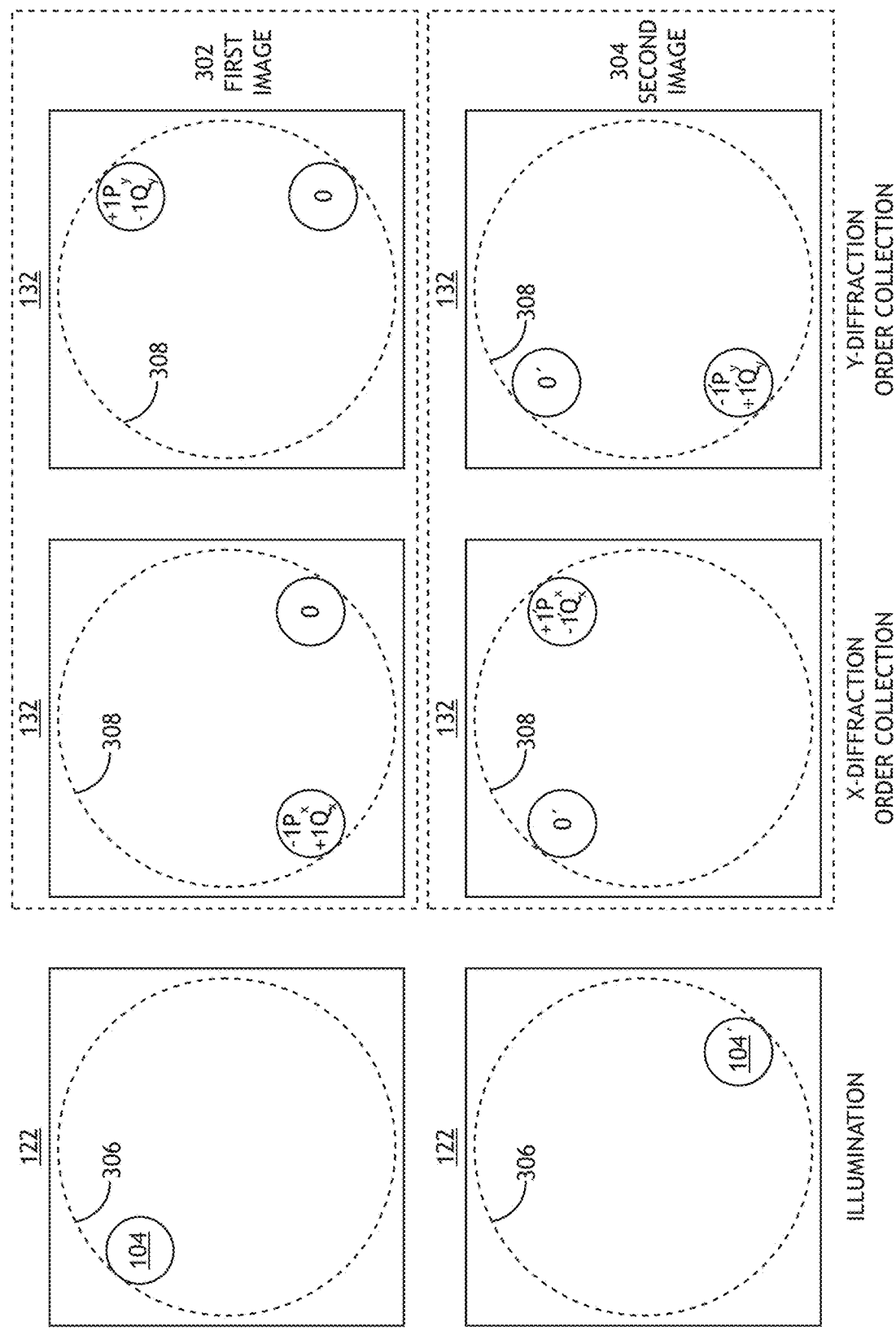
FIG. 14 depicts illumination and collection conditions suitable for amplitude asymmetry measurements based on bright-field imaging of one-dimensional overlay targets with overlapping periodic structures with different periods using rotated off-axis illumination, in accordance with one or more embodiments of the present disclosure.

FIG. 14 depicts illumination and collection conditions suitable for amplitude asymmetry measurements based on bright-field imaging of one-dimensional overlay targets 106 with overlapping periodic structures with different periods (e.g., as illustrated in FIGS. 2B-2C) using rotated off-axis illumination 104, in accordance with one or more embodiments of the present disclosure. In FIG. 14, the collection pupil planes 132 each include a double-diffraction lobe and a zero-order diffraction lobe. In this configuration, the Moiré pattern is imaged, but the target features with periods P and Q are unresolved.

Figure 15:
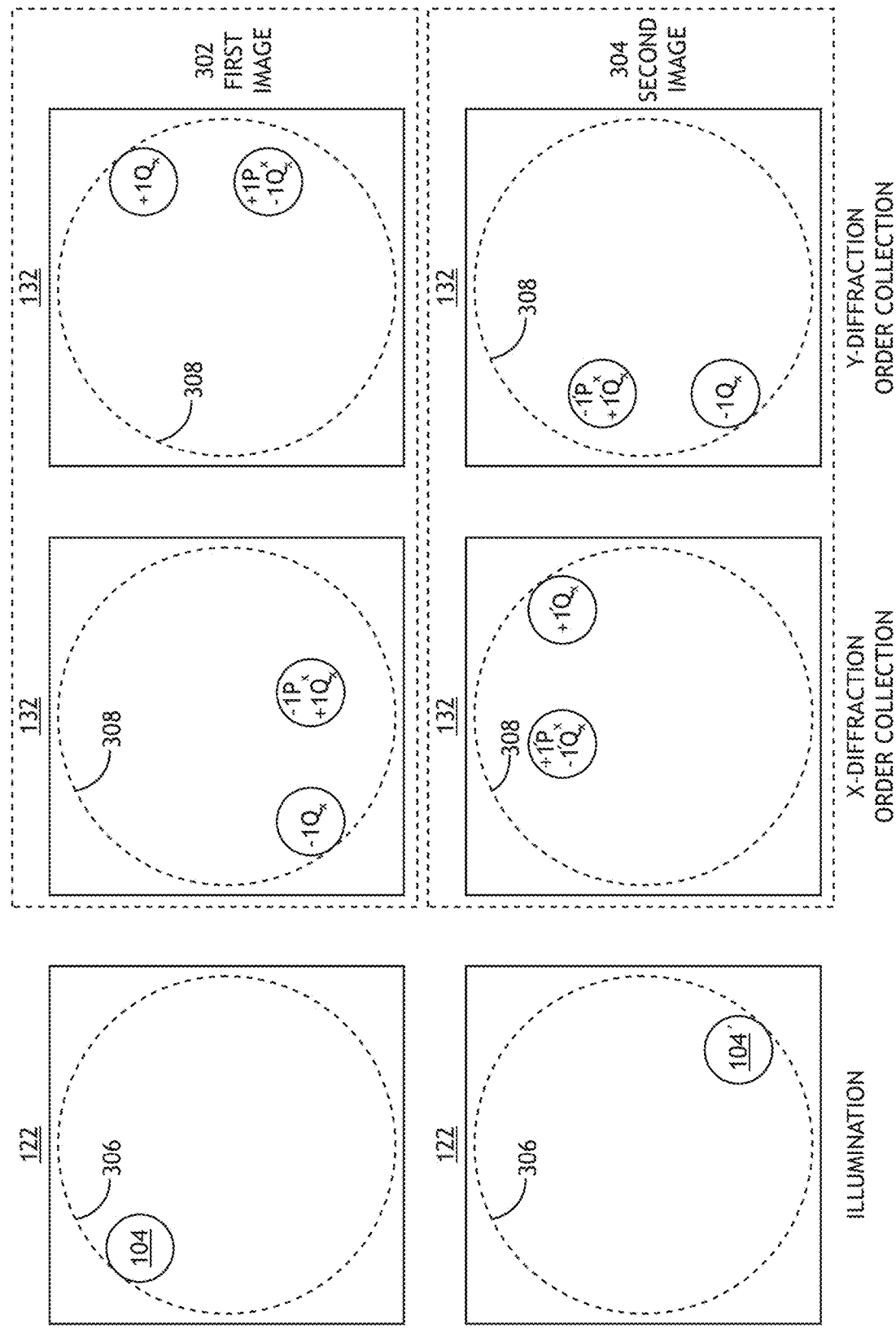
FIG. 15 depicts first illumination and collection conditions suitable for amplitude asymmetry measurements based on dark-field imaging of one-dimensional overlay targets with overlapping periodic structures with different periods using rotated off-axis illumination, in accordance with one or more embodiments of the present disclosure.

FIG. 15 depicts first illumination and collection conditions suitable for amplitude asymmetry measurements based on dark-field imaging of one-dimensional overlay targets 106 with overlapping periodic structures with different periods (e.g., as illustrated in FIGS. 2B-2C) using rotated off-axis illumination 104, in accordance with one or more embodiments of the present disclosure. The configuration of FIG. 15 is similar to FIG. 7, except for the positions of the illumination beams and the associated diffraction orders.

Figure 16:
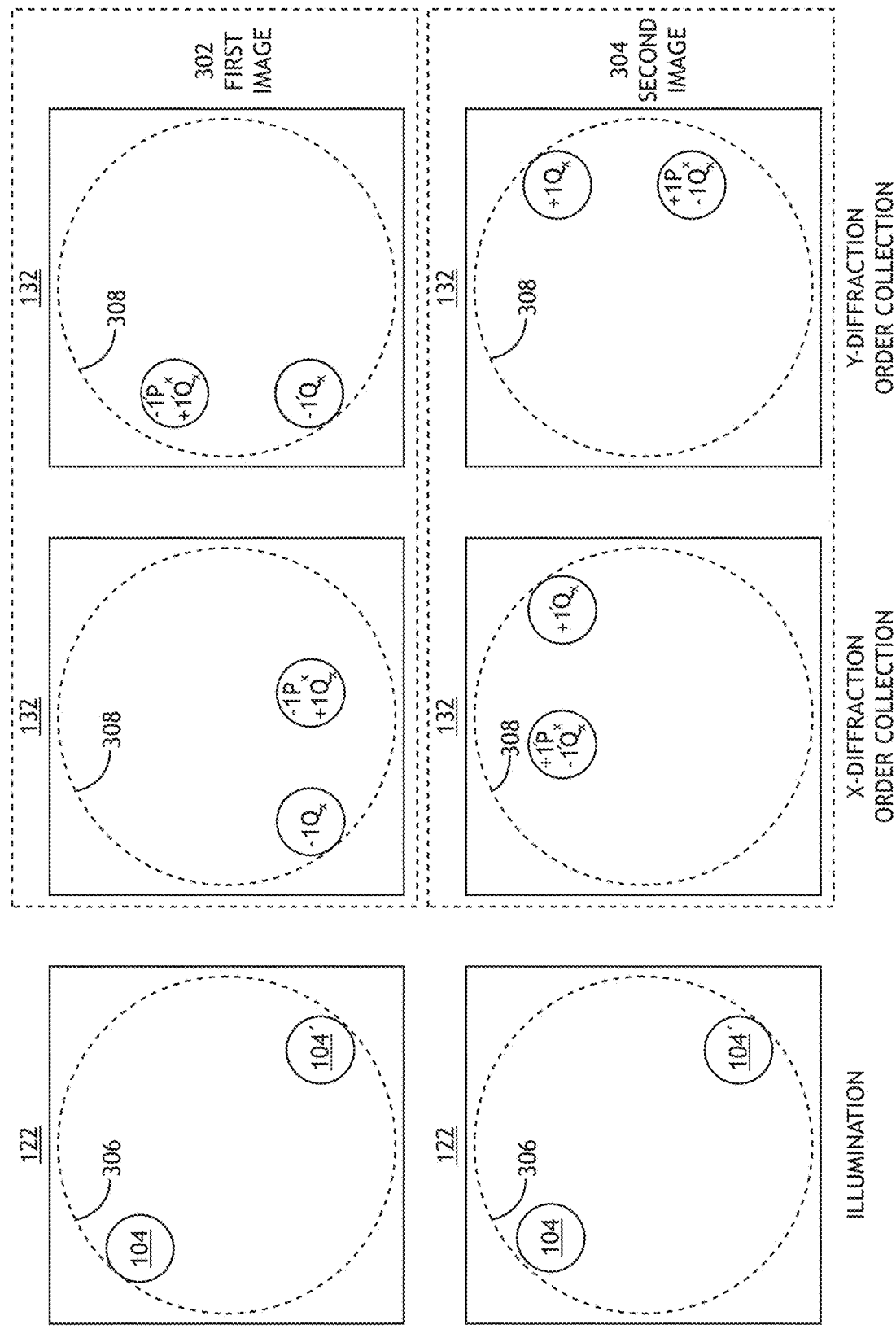
FIG. 16 depicts second illumination and collection conditions suitable for amplitude asymmetry measurements based on dark-field imaging of one-dimensional overlay targets with overlapping periodic structures with different periods using rotated dipole illumination, in accordance with one or more embodiments of the present disclosure.

FIG. 16 depicts second illumination and collection conditions suitable for amplitude asymmetry measurements based on dark-field imaging of one-dimensional overlay targets 106 with overlapping periodic structures with different periods (e.g., as illustrated in FIGS. 2B-2C) using rotated dipole illumination 104, in accordance with one or more embodiments of the present disclosure. The configuration of FIG. 16 is similar to FIG. 15, except for use of rotated dipole illumination 104 instead of a single beam of illumination 104.

FIGS. 17-22 depict various non-limiting configurations for measurement of amplitude asymmetry based on illumination 104 with rotated off-axis illumination beams. In particular, the configurations in FIGS. 17-22 may be implemented using a quadrupole distribution of the illumination 104.

Figure 17:
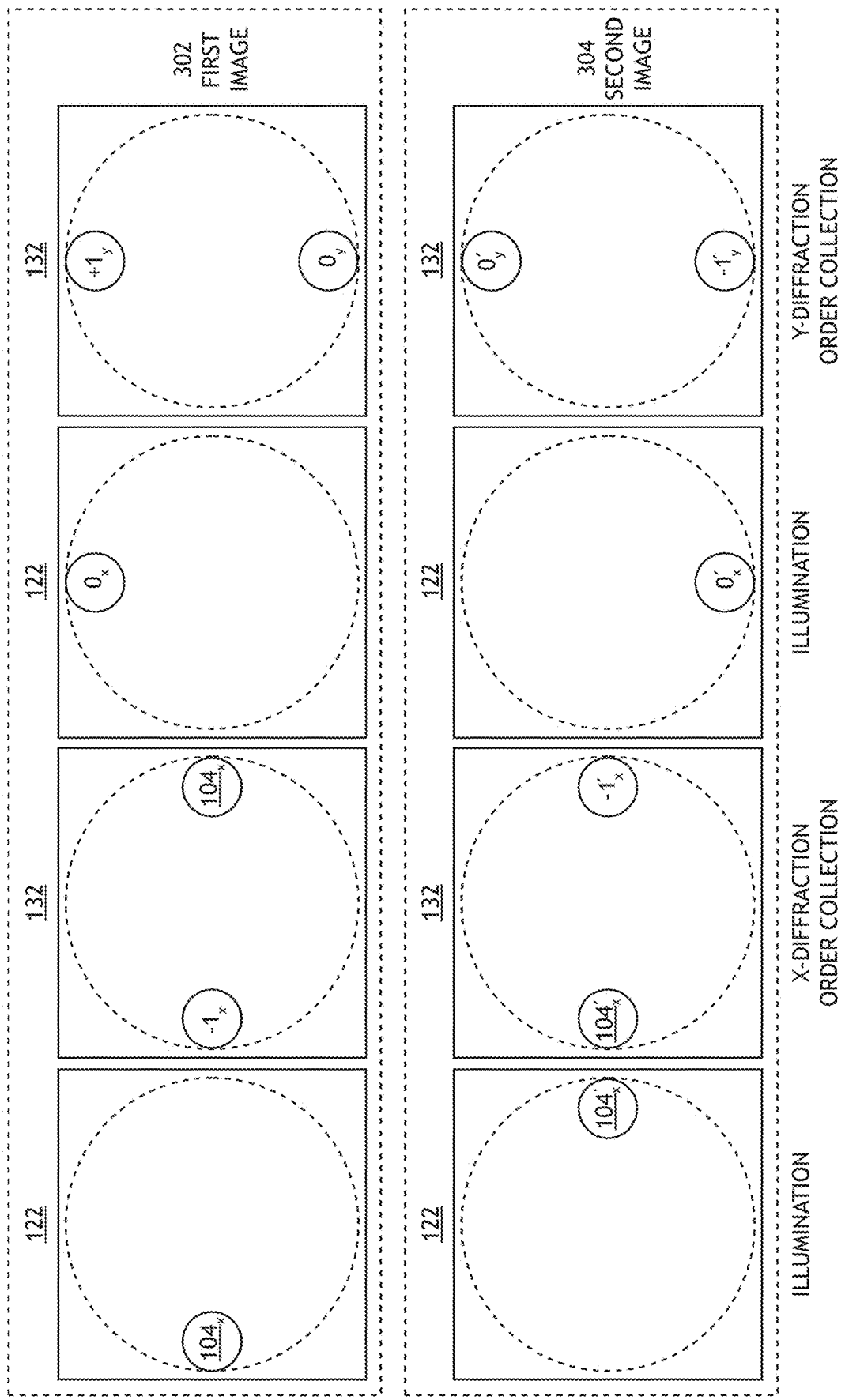
FIG. 17 depicts first illumination and collection conditions suitable for amplitude asymmetry measurements based on bright-field imaging of one-dimensional overlay targets with non-overlapping periodic structures using off-axis illumination, in accordance with one or more embodiments of the present disclosure.

FIG. 17 depicts first illumination and collection conditions suitable for amplitude asymmetry measurements based on bright-field imaging of one-dimensional overlay targets 106 with non-overlapping periodic structures using off-axis illumination 104, in accordance with one or more embodiments of the present disclosure. The configuration of FIG. 17 is similar to FIG. 3, except for the positions of the illumination beams and the associated diffraction orders.

Figure 18:
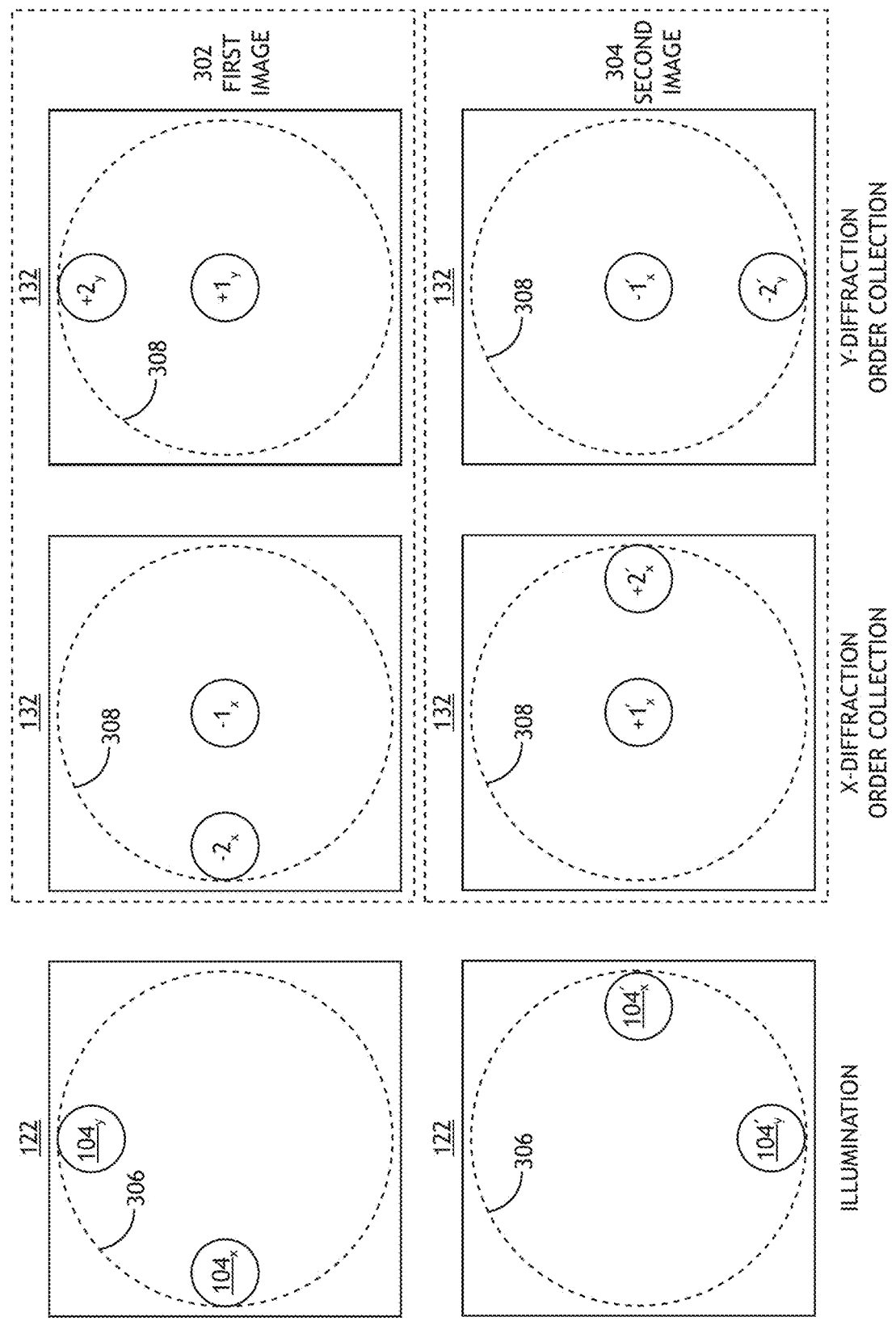
FIG. 18 depicts first illumination and collection conditions suitable for amplitude asymmetry measurements based on dark-field imaging of one-dimensional overlay targets with non-overlapping periodic structures using off-axis illumination, in accordance with one or more embodiments of the present disclosure.

FIG. 18 depicts first illumination and collection conditions suitable for amplitude asymmetry measurements based on dark-field imaging of one-dimensional overlay targets 106 with non-overlapping periodic structures using off-axis illumination 104, in accordance with one or more embodiments of the present disclosure. The configuration of FIG. 18 is similar to FIG. 9, except for the simultaneous illumination with two orthogonal beams of illumination 104.

Figure 19:
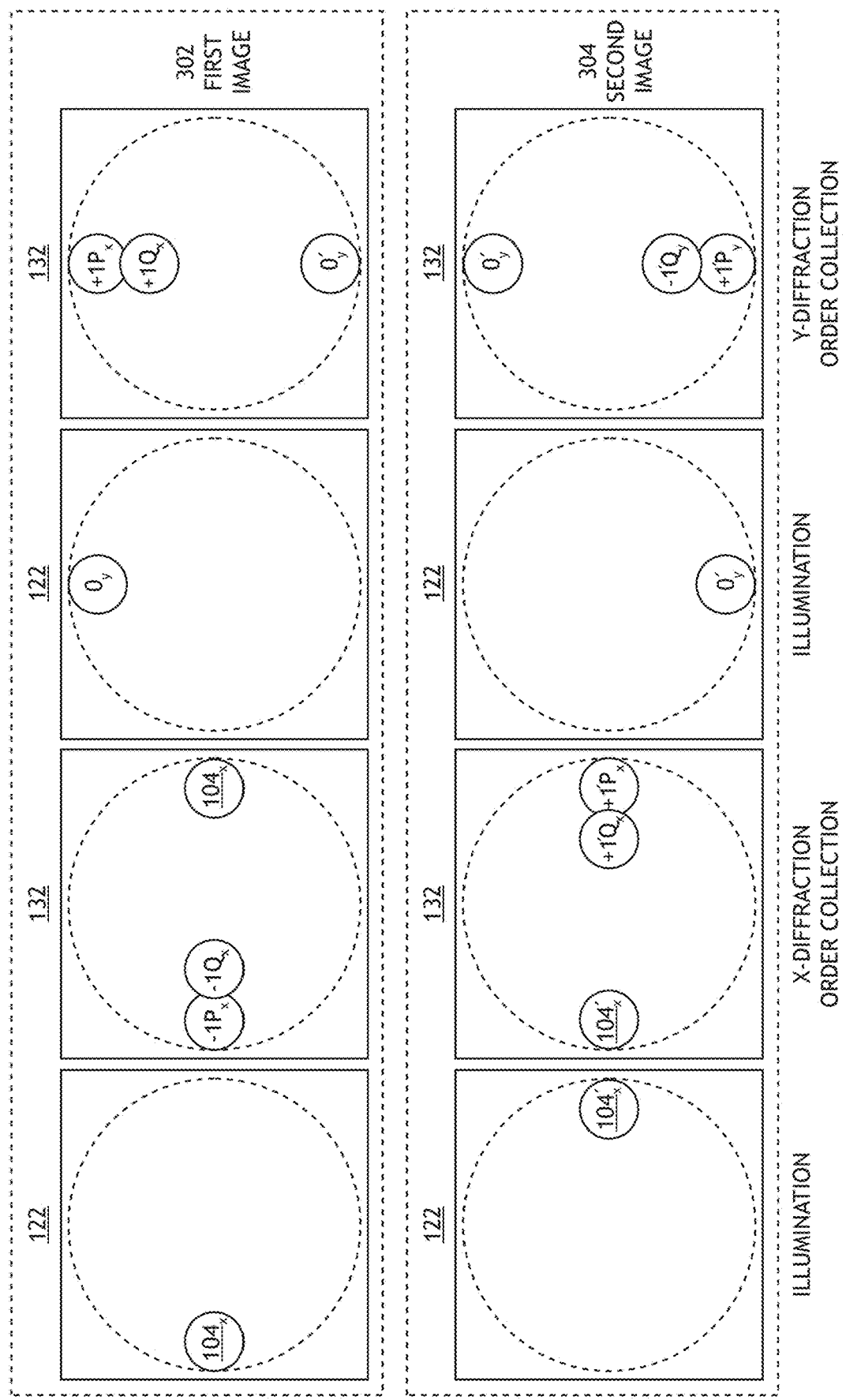
FIG. 19 depicts illumination and collection conditions suitable for amplitude asymmetry measurements based on bright-field imaging of one-dimensional overlay targets with overlapping periodic structures with different periods using off-axis illumination, in accordance with one or more embodiments of the present disclosure.

FIG. 19 depicts illumination and collection conditions suitable for amplitude asymmetry measurements based on bright-field imaging of one-dimensional overlay targets 106 with overlapping periodic structures with different periods (e.g., as illustrated in FIGS. 2B-2C) using off-axis illumination 104, in accordance with one or more embodiments of the present disclosure. The configuration of FIG. 19 is similar to FIG. 5A, except for the positions of the illumination beams and the associated diffraction orders.

Figure 20:
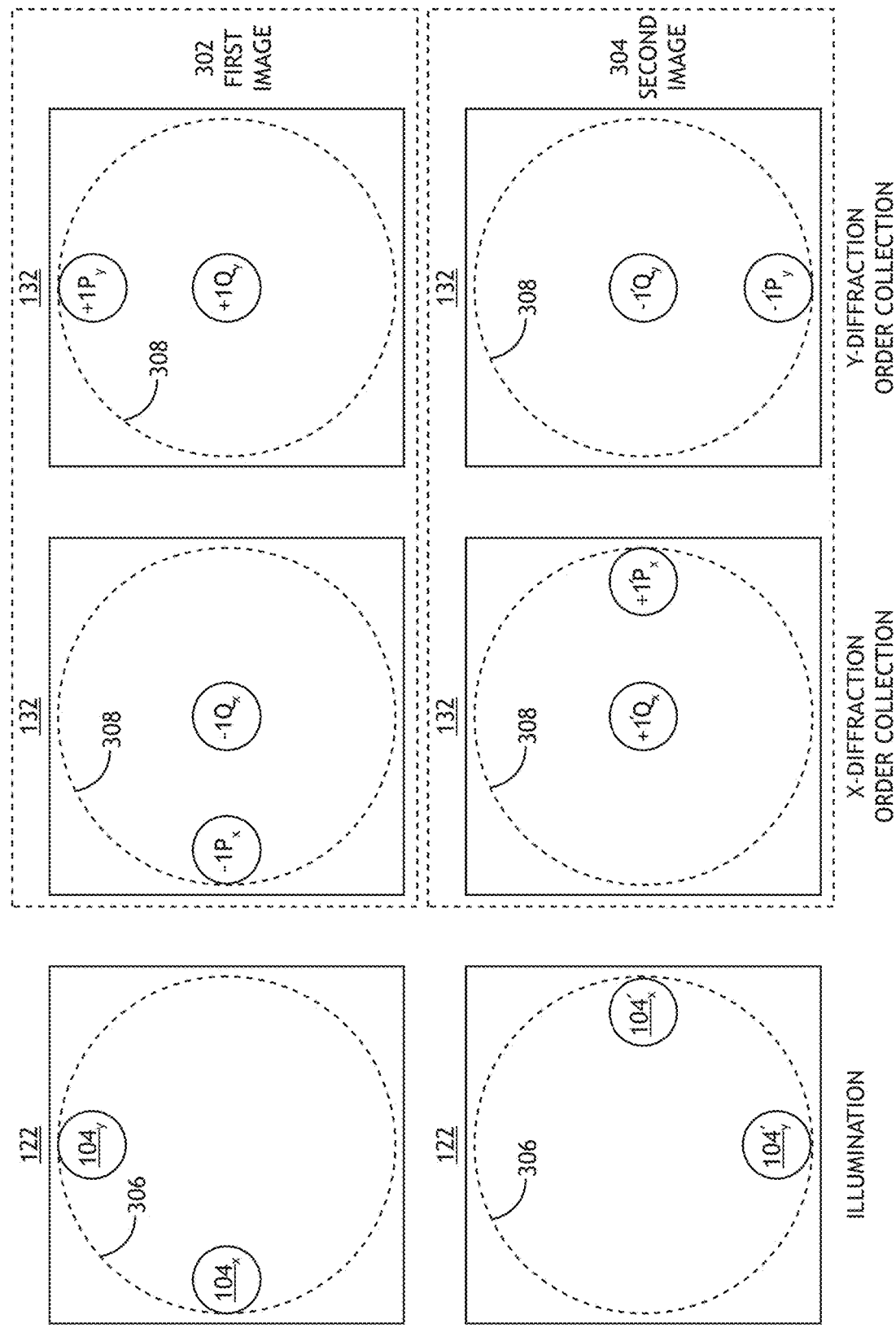
FIG. 20 depicts illumination and collection conditions suitable for amplitude asymmetry measurements based on dark-field imaging of one-dimensional overlay targets with overlapping periodic structures with different periods using off-axis illumination, in accordance with one or more embodiments of the present disclosure.

FIG. 20 depicts illumination and collection conditions suitable for amplitude asymmetry measurements based on dark-field imaging of one-dimensional overlay targets 106 with overlapping periodic structures with different periods (e.g., as illustrated in FIGS. 2B-2C) using off-axis illumination 104, in accordance with one or more embodiments of the present disclosure. FIG. 20 is substantially similar to FIG. 6, except for the simultaneous illumination with two orthogonal beams of illumination 104.

Figure 21:
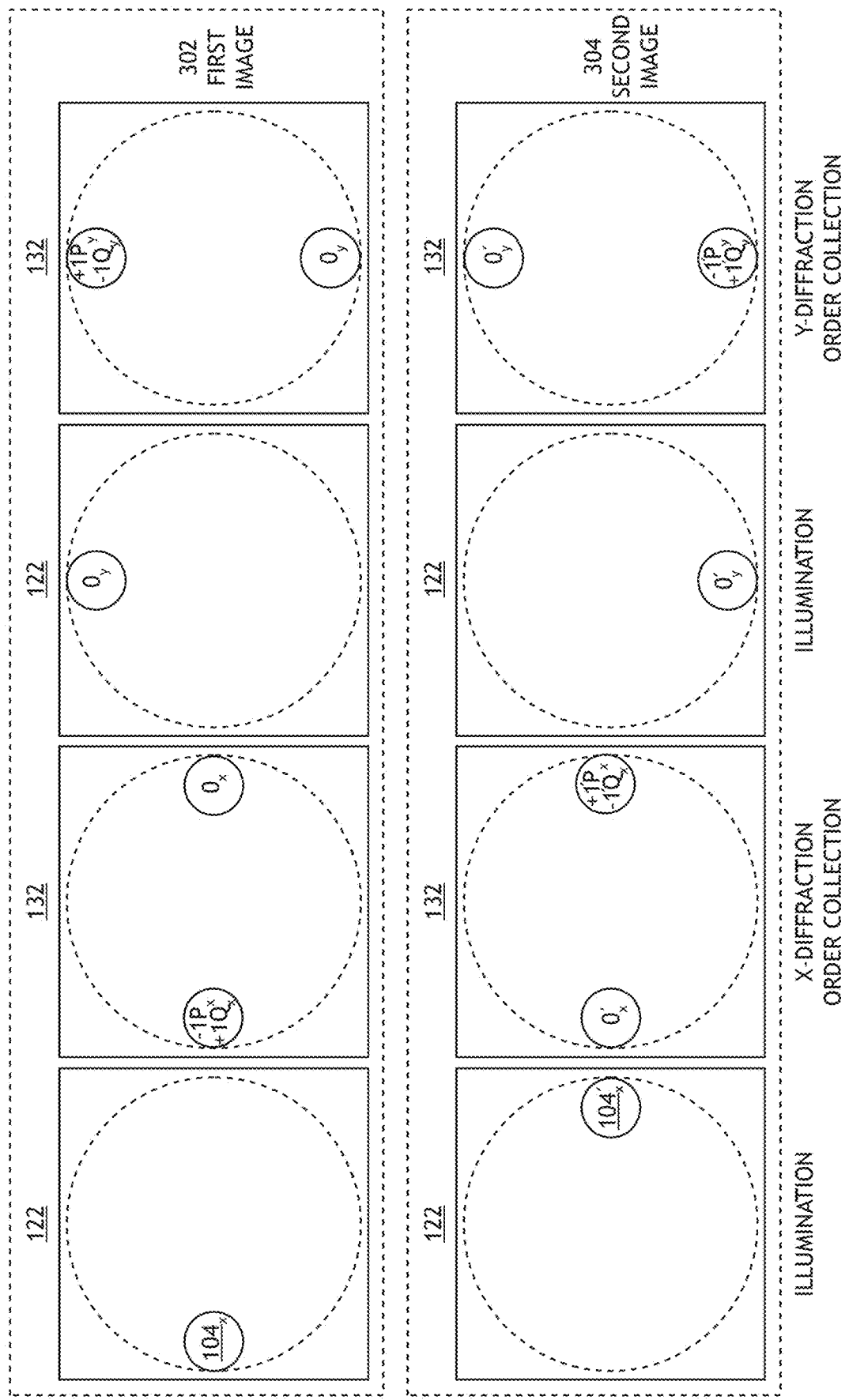
FIG. 21 depicts illumination and collection conditions suitable for amplitude asymmetry measurements based on bright-field imaging of one-dimensional overlay targets with overlapping periodic structures with different periods using off-axis illumination, in accordance with one or more embodiments of the present disclosure.

FIG. 21 depicts illumination and collection conditions suitable for amplitude asymmetry measurements based on bright-field imaging of one-dimensional overlay targets 106 with overlapping periodic structures with different periods (e.g., as illustrated in FIGS. 2B-2C) using off-axis illumination 104, in accordance with one or more embodiments of the present disclosure. The configuration of FIG. 21 is similar to FIG. 14, except for the positions of the illumination beams and the associated diffraction orders.

Figure 22:
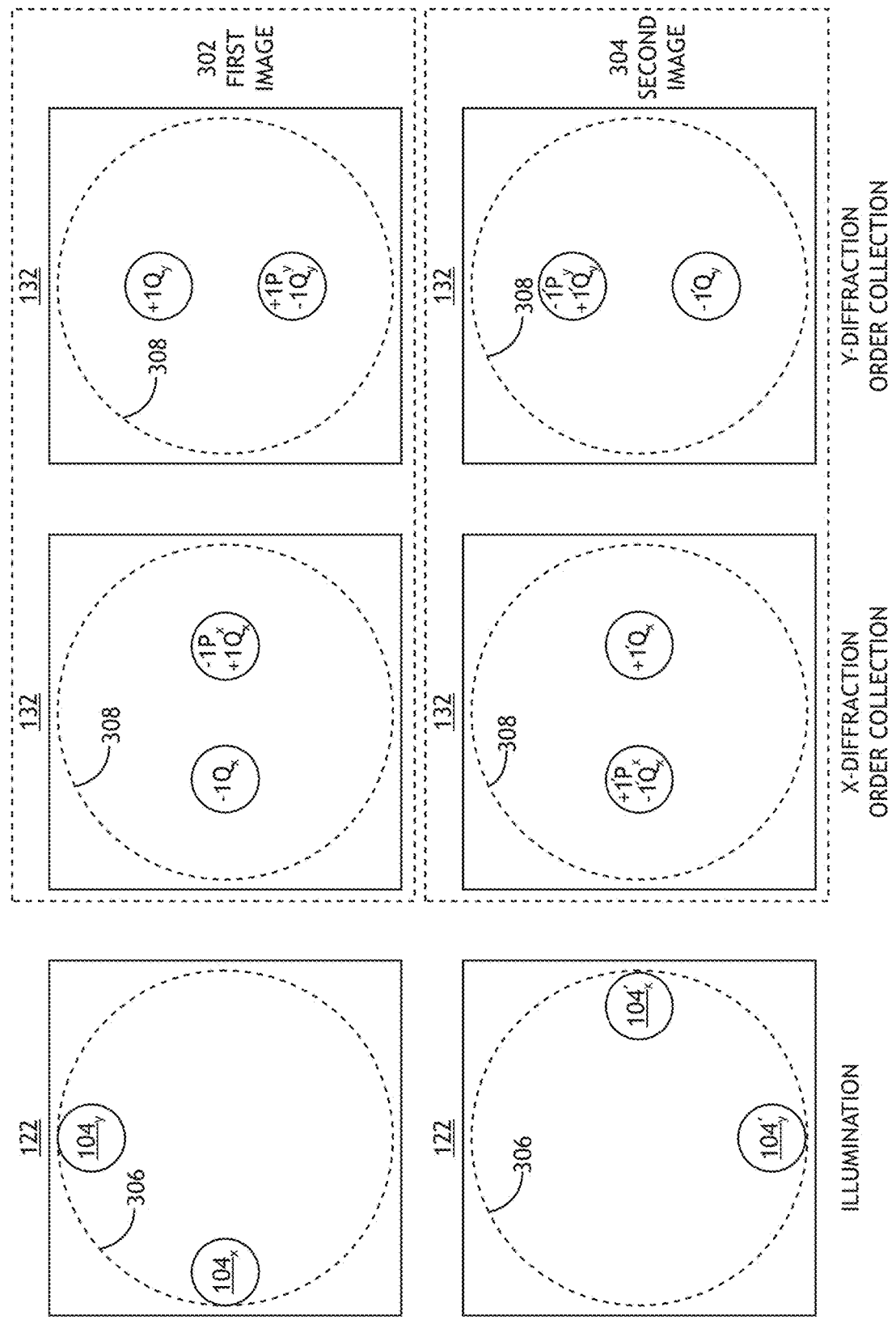
FIG. 22 depicts illumination and collection conditions suitable for amplitude asymmetry measurements based on dark-field imaging of one-dimensional overlay targets with overlapping periodic structures with different periods using axial illumination, in accordance with one or more embodiments of the present disclosure.

FIG. 22 depicts illumination and collection conditions suitable for amplitude asymmetry measurements based on dark-field imaging of one-dimensional overlay targets 106 with overlapping periodic structures with different periods (e.g., as illustrated in FIGS. 2B-2C) using axial illumination 104, in accordance with one or more embodiments of the present disclosure. The configuration of FIG. 22 is similar to FIG. 7, except for the simultaneous illumination with two orthogonal beams of illumination 104.

Referring generally to FIGS. 3-22, it is to be understood that FIGS. 3-22 and the associated descriptions are provided solely for illustrative purposes and should not be interpreted as limiting. Rather, it is contemplated that first image 302 and second image 304 formed based on opposing diffraction orders suitable using any suitable type of overlay target 106 for the measurement of amplitude asymmetry as described with respect to Equations (8)-(10) are within the spirit and scope of the present disclosure. Further, depictions of configurations for one-dimensional overlay targets 106 in FIGS. 3-22 are provided solely for illustrative purposes, but it is to be understood that the concepts disclosed herein may be extended by one of ordinary skill in the art to two-dimensional targets.

Referring again to FIGS. 1A-1B, various aspects of the metrology system 100 are described in greater detail, in accordance with one or more embodiments of the present disclosure.

The optical sub-system 102 may generate overlay measurements based on the two or more images of the overlay target 106. For example, the optical sub-system 102 may generate different overlay measurements based on different measurement conditions.

The optical sub-system 102 may be configurable according to one or more metrology recipes. A metrology recipe may generally include a set of parameters associated with an overlay target 106 design, a layout of overlay targets 106 (or other suitable locations) to be characterized, illumination conditions for characterizing an overlay target 106, and/or collection conditions for imaging the overlay target 106. In this way, the metrology recipe may specify conditions suitable for obtaining one or more images of the overlay target 106 that are suitable for an overlay measurement. A metrology recipe may further include one or more analysis steps for generating a value of an overlay measurement based on the one or more images.

In some embodiments, the metrology system 100 includes a controller 144. The controller 144 may include one or more processors 146 configured to execute program instructions maintained on memory 148, or memory medium. In this regard, the one or more processors 146 of controller 144 may execute any of the various process steps described throughout the present disclosure. For example, the program instructions may cause the one or more processors 146 to implement and/or direct the implementation of any of the various process steps described throughout the present disclosure. Further, the controller 144 may be communicatively coupled to the optical sub-system 102 or any component therein.

The one or more processors 146 of a controller 144 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 146 may include any device configured to execute algorithms and/or instructions (e.g., program instructions stored in memory). In some embodiments, the one or more processors 146 may be embodied as a desktop computer, mainframe computer system, workstation, image computer, parallel processor, networked computer, or any other computer system configured to execute a program configured to operate or operate in conjunction with the metrology system 100, as described throughout the present disclosure.

Moreover, different subsystems of the metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 144 or, alternatively, multiple controllers. Additionally, the controller 144 may include one or more controllers housed in a common housing or within multiple housings. In this way, any controller or combination of controllers may be separately packaged as a module suitable for integration into the metrology system 100.

The memory 148 may include any storage medium known in the art suitable for storing program instructions executable by the associated one or more processors 146. For example, the memory 148 may include a non-transitory memory medium. By way of another example, the memory 148 may include, but is not limited to, a read-only memory (ROM), a random-access memory (RAM), a magnetic or optical memory device (e.g., disk), a magnetic tape, a solid-state drive and the like. It is further noted that memory 148 may be housed in a common controller housing with the one or more processors 146. In some embodiments, the memory 148 may be located remotely with respect to the physical location of the one or more processors 146 and controller 144. For instance, the one or more processors 146 of controller 144 may access a remote memory (e.g., server), accessible through a network (e.g., internet, intranet and the like).

Further, the overlay tool may be configurable to generate overlay signals (e.g., using the controller 144) based on any number of metrology recipes defining conditions for generating one or more images of an overlay target 106 suitable for two or more overlay measurements. For example, a metrology recipe may include design parameters of the overlay target 106 or cell sets thereof such as, but not limited to, a distribution of target features, a pitch of target features, dimensions of target features (e.g., widths, sidewall angles, or the like), orientations of target features, or a sample height during a measurement (e.g., a working distance between the sample 108 and the optical sub-system 102). As another example, a metrology recipe may include illumination parameters (e.g., properties of the illumination 104) such as, but not limited to, spectrum, polarization, illumination angle (e.g., in altitude and/or azimuth directions), or illumination field size (e.g., a spot size of the illumination 104). As another example, a metrology recipe may include collection parameters associated with light used to image the overlay target 106 (e.g., a portion of the sample light 110) such as, but not limited to, a spectrum, a polarization, a collection angle (e.g., in altitude and/or azimuth directions), or collection field size. As another example, a metrology recipe may include parameters associated with one or more detectors 112 used to generate one or more images of the overlay target 106 such as, but not limited to, gain settings or measurement timing settings. As another example, a metrology recipe may include one or more steps to generate at least two overlay measurements based on one or more images of the overlay target 106. Such steps may be, but are not required to be, carried out by the controller 144. As an illustration, some overlay techniques may generate an overlay measurement by determining centers of symmetry of non-overlapping features associated with different patterning processes in one or more field-plane images and determining an overlay measurement based on relative positions of these centers of symmetry. As another illustration, some overlay techniques may generate an overlay measurement based on interference patterns of overlapping features associated with different patterning processes captured using field-plane and/or pupil-plane images.

Figure 23:
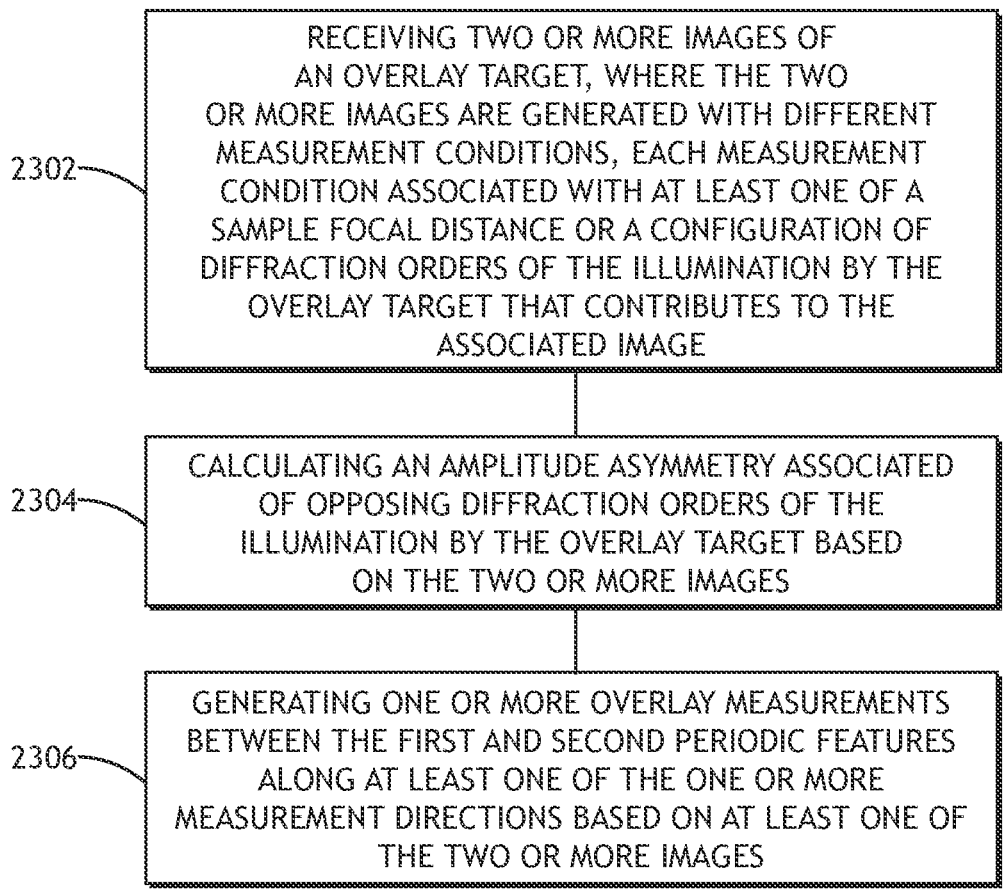
FIG. 23 is a flow diagram illustrating steps performed in a method for measuring amplitude asymmetry in overlay metrology, in accordance with one or more embodiments of the present disclosure.

Referring now to FIG. 23, FIG. 23 is a flow diagram illustrating steps performed in a method 2300 for measuring amplitude asymmetry in overlay metrology, in accordance with one or more embodiments of the present disclosure. Applicant notes that the embodiments and enabling technologies described previously herein in the context of the metrology system 100 should be interpreted to extend to the method 2300. It is further noted, however, that the method 2300 is not limited to the architecture of the metrology system 100.

In some embodiments, the method 2300 includes a step 2302 of receiving two or more images (e.g., at least a first image and a second image) of an overlay target 106, where the two or more images are generated with different measurement conditions, each measurement condition associated with at least one of a sample focal distance or a configuration of diffraction orders of the illumination by the overlay target that contributes to the associated image. For example, the two or more images may include images generated at different sample focal positions. As another example, the two or more images may include images formed from opposing diffraction orders (e.g., a first image formed form positive diffraction orders and a second image formed form negative diffraction orders).

In some embodiments, the method 2300 includes a step 2304 of calculating an amplitude asymmetry associated of opposing diffraction orders of the illumination by the overlay target based on the two or more images. For example, Equations (1)-(7) may be used to determine an amplitude asymmetry based on images generated at different sample focal positions. As another example, Equations (8)-(10) may be used to determine an amplitude asymmetry based on images formed from opposing diffraction orders.

In some embodiments, the method 2300 includes a step 2306 of generating one or more quality metrics associated with the overlay target based on the amplitude asymmetry. For example, the amplitude asymmetry may be utilized alone or with other parameters as a quality metric associated with the overlay target 106. As described previously herein, an amplitude asymmetry may be an indication that the overlay target 106 is not being fabricated properly, either due to process drifts or incompatibility with a fabrication process. Accordingly, a quality metric at least partially based on a measured amplitude asymmetry may be used to address such fabrication issues. For example, such a quality metric may be used for process control to generate feedback and/or feed-forward correctables to adjust a process tool such as, but not limited to, a lithography tool. As another example, such a quality metric may be used to evaluate a robustness of an overlay target 106. As an illustration, the method 2300 may be repeated for multiple candidate overlay targets 106, where quality metrics based on amplitude asymmetry of these overlay targets 106 may be used to select one of the overlay targets 106 (e.g., an overlay target 106 having a lowest amplitude asymmetry) for use in a production environment.

Further, in some embodiments, the method 2300 may include generating an overlay measurement for the overlay target 106 based on the one or more images. In some embodiments, the overlay measurement may be further corrected or calibrated using the amplitude asymmetry (or a quality metric associated with the amplitude asymmetry), which may reduce or eliminate the impact of the amplitude asymmetry in the measurement.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
 a controller communicatively coupled to an optical subsystem configured to illuminate an overlay target on a sample with illumination from an illumination source when implementing a metrology recipe, wherein the overlay target in accordance with the metrology recipe includes first and second periodic features distributed along one or more measurement directions, wherein the first and second periodic features are associated with different patterning steps of a fabrication process for fabricating the overlay target, wherein the controller includes one or more processors configured to execute program instructions causing the one or more processors to implement the metrology recipe by:
  receiving two or more images of the overlay target from one or more detectors of the optical sub-system, wherein the two or more images are generated with different measurement conditions, each measurement condition associated with at least one of a sample focal distance or a configuration of diffraction orders of the illumination by the overlay target that contributes to the associated one of the two or more images;
  calculating an amplitude asymmetry associated of opposing diffraction orders of the illumination by the overlay target based on the two or more images; and
  generating one or more quality metrics associated with the overlay target based on the amplitude asymmetry.

2. The metrology system of claim 1, wherein the one or more processors are further configured to execute program instructions causing the one or more processors to implement the metrology recipe by controlling, via control signals, one or more process tools based on the one or more quality metrics.

3. The metrology system of claim 1, wherein the one or more processors are further configured to execute program instructions causing the one or more processors to implement the metrology recipe by generating an overlay measurement associated with the overlay target based on the two or more images.

4. The metrology system of claim 1, wherein the one or more processors are further configured to execute program instructions causing the one or more processors to correct an overlay measurement based on at least one of the two or more images using the amplitude asymmetry.

5. The metrology system of claim 1, wherein the two or more images include a first image at a first sample focal distance and a second image at a second sample focal distance, wherein calculating the amplitude asymmetry associated of opposing diffraction orders of the illumination by the overlay target based on the two or more images comprises:
 calculating a first contrast of imaged periodic features in the first image;
 calculating a second contrast of the imaged periodic features in the second image; and
 calculating the amplitude asymmetry based on the first contrast, the second contrast, and at least one of a difference in overlay measured based on the first and second images or a difference in center of symmetry positions of the imaged periodic features in the first and second images.

6. The metrology system of claim 1, wherein the two or more images include first and second images at a common sample focal distance, wherein the first image includes one or more positive diffraction orders from the overlay target, wherein the second image includes one or more negative diffraction orders from the overlay target, wherein calculating the amplitude asymmetry associated of opposing diffraction orders of the illumination by the overlay target based on the two or more images comprises:
 calculating the amplitude asymmetry based on a difference in amplitudes of the first or second periodic features based on the first and second images.

7. The metrology system of claim 1, wherein the first and second periodic features are non-overlapping features.

8. The metrology system of claim 1, wherein the first and second periodic features are overlapping features.

9. The metrology system of claim 8, wherein the first and second periodic features have a common pitch.

10. The metrology system of claim 8, wherein the first and second periodic features have different pitches.

11. The metrology system of claim 1, wherein the illumination from the illumination source comprises:
a single beam of illumination at a normal incidence angle.

12. The metrology system of claim 1, wherein the illumination from the illumination source comprises:
a single beam of illumination at an oblique incidence angle.

13. The metrology system of claim 1, wherein the illumination from the illumination source comprises:
a dipole including two beams of illumination with oblique incidence angles.

14. The metrology system of claim 1, wherein the illumination from the illumination source comprises:
a quadrupole including four beams of illumination with oblique incidence angles.

15. The metrology system of claim 1, wherein the two or more images are generated simultaneously.

16. The metrology system of claim 1, wherein the two or more images are generated sequentially.

17. A metrology system comprising:
an optical sub-system comprising:
one or more optical elements configured to illuminate an overlay target on a sample with illumination from an illumination source when implementing a metrology recipe, wherein the overlay target in accordance with the metrology recipe includes first and second periodic features distributed along one or more measurement directions, wherein the first and second periodic features are associated with different patterning steps of a fabrication process for fabricating the overlay target;
a collection sub-system comprising:
one or more detectors; and
one or more optical elements to direct light from the overlay target to the one or more detectors; and
a controller communicatively coupled to the optical sub-system, wherein the controller includes one or more processors configured to execute program instructions causing the one or more processors to implement the metrology recipe by:
receiving two or more images of the overlay target from the one or more detectors, wherein the two or more images are generated with different measurement conditions, each measurement condition associated with at least one of a sample focal distance or a configuration of diffraction orders of the illumination by the overlay target that contributes to the associated one of the two or more images;
calculating an amplitude asymmetry associated with opposing diffraction orders of the illumination by the overlay target based on the two or more images; and
generating one or more quality metrics associated with the overlay target based on the amplitude asymmetry.

18. The metrology system of claim 17, wherein the one or more processors are further configured to execute program instructions causing the one or more processors to implement the metrology recipe by controlling, via control signals, one or more process tools based on the one or more quality metrics.

19. The metrology system of claim 17, wherein the one or more processors are further configured to execute program instructions causing the one or more processors to implement the metrology recipe by generating an overlay measurement associated with the overlay target based on the two or more images.

20. The metrology system of claim 17, wherein the one or more processors are further configured to execute program instructions causing the one or more processors to correct an overlay measurement based on at least one of the two or more images using the amplitude asymmetry.

21. The metrology system of claim 17, wherein the two or more images include a first image at a first sample focal distance and a second image at a second sample focal distance, wherein calculating the amplitude asymmetry associated of opposing diffraction orders of the illumination by the overlay target based on the two or more images comprises:
calculating a first contrast of imaged periodic features in the first image;
calculating a second contrast of the imaged periodic features in the second image; and
calculating the amplitude asymmetry based on the first contrast, the second contrast, and at least one of a difference in overlay measured based on the first and second images or a difference in center of symmetry positions of the imaged periodic features based on the first and second images.

22. The metrology system of claim 17, wherein the two or more images include first and second images at a common sample focal distance, wherein the first image includes one or more positive diffraction orders from the overlay target, wherein the second image includes one or more negative diffraction orders from the overlay target, wherein calculating the amplitude asymmetry associated of opposing diffraction orders of the illumination by the overlay target based on the two or more images comprises:
calculating the amplitude asymmetry based on a difference in amplitudes of the first or second periodic features based on the first and second images.

23. The metrology system of claim 17, further comprising:
correcting an overlay measurement based on at least one of the first or second images using the amplitude asymmetry.

24. The metrology system of claim 17, wherein the first and second periodic features are non-overlapping features.

25. The metrology system of claim 17, wherein the first and second periodic features are overlapping features.

26. The metrology system of claim 25, wherein the first and second periodic features have a common pitch.

27. The metrology system of claim 25, wherein the first and second periodic features have different pitches.

28. The metrology system of claim 17, wherein the illumination from the illumination source comprises:
a single beam of illumination at a normal incidence angle.

29. The metrology system of claim 17, wherein the illumination from the illumination source comprises:
a single beam of illumination at an oblique incidence angle.

30. The metrology system of claim 17, wherein the illumination from the illumination source comprises:
a dipole including two beams of illumination with oblique incidence angles.

31. The metrology system of claim 17, wherein the illumination from the illumination source comprises:
a quadrupole including four beams of illumination with oblique incidence angles.

32. The metrology system of claim 17, wherein the two or more images are generated simultaneously.

33. The metrology system of claim 17, wherein the two or more images are generated sequentially.

34. An overlay metrology method, comprising:
receiving two or more images of an overlay target from one or more detectors of an optical sub-system configured to illuminate an overlay target on a sample with illumination from an illumination source when implementing a metrology recipe, wherein the overlay target in accordance with the metrology recipe includes first and second periodic features distributed along one or more measurement directions, wherein the first and second periodic features are associated with different patterning steps of a fabrication process for fabricating the overlay target, wherein the two or more images are generated with different measurement conditions, each measurement condition associated with at least one of a sample focal distance or a configuration of diffraction orders of the illumination by the overlay target that contributes to the associated image;

calculating an amplitude asymmetry associated of opposing diffraction orders of the illumination by the overlay target based on the two or more images; and generating one or more quality metrics associated with the overlay target based on the amplitude asymmetry.

* * * * *